United States Patent
Yun et al.

(10) Patent No.: US 8,835,993 B2
(45) Date of Patent: Sep. 16, 2014

(54) GATE-ALL-AROUND INTEGRATED CIRCUIT DEVICES

(75) Inventors: Eun-jung Yun, Seoul (KR); Sung-young Lee, Gyeonggi-do (KR); Min-sang Kim, Seoul (KR); Sung-min Kim, Incheon (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 13/411,699

(22) Filed: Mar. 5, 2012

(65) Prior Publication Data

US 2012/0161247 A1    Jun. 28, 2012

Related U.S. Application Data

(63) Continuation of application No. 11/374,644, filed on Mar. 13, 2006, now Pat. No. 8,129,800.

(30) Foreign Application Priority Data

Aug. 30, 2005 (KR) .................................. 2005-79958

(51) Int. Cl.
*H01L 29/78* (2006.01)
*H01L 29/786* (2006.01)
*H01L 29/423* (2006.01)

(52) U.S. Cl.
CPC .... *H01L 29/78696* (2013.01); *H01L 29/42392* (2013.01)
USPC .................................. 257/241; 257/E29.255

(58) Field of Classification Search
None
See application file for complete search history.

(56) References Cited

U.S. PATENT DOCUMENTS

| | | | |
|---|---|---|---|
| 5,482,877 A | 1/1996 | Rhee | 438/157 |
| 5,580,802 A | 12/1996 | Mayer et al. | 438/157 |
| 6,133,124 A * | 10/2000 | Horstmann et al. | 438/525 |
| 6,245,636 B1 * | 6/2001 | Maszara | 438/411 |
| 6,605,847 B2 | 8/2003 | Kim et al. | 257/401 |
| 6,686,630 B2 | 2/2004 | Hanafi et al. | 257/366 |
| 6,740,938 B2 | 5/2004 | Tsunoda et al. | 257/365 |
| 6,794,306 B2 | 9/2004 | Kim et al. | 438/752 |
| 2004/0063286 A1 | 4/2004 | Kim et al. | 438/283 |
| 2004/0152272 A1 | 8/2004 | Fladre et al. | 438/284 |
| 2004/0262690 A1 | 12/2004 | Coronel et al. | 257/365 |
| 2005/0037603 A1 | 2/2005 | Coronel et al. | 438/619 |
| 2005/0121703 A1 | 6/2005 | Hieda et al. | 257/288 |

FOREIGN PATENT DOCUMENTS

| | | |
|---|---|---|
| JP | 2005-079517 | 3/2005 |
| KR | 1020020078996 | 10/2002 |

* cited by examiner

*Primary Examiner* — Wensing Kuo
(74) *Attorney, Agent, or Firm* — Myers Bigel Sibley & Sajovec, PA

(57) ABSTRACT

Gate-all-around integrated circuit devices include first and second source/drain regions on an active area of an integrated circuit substrate. The first and second source/drain regions form p-n rectifying junctions with the active area. A channel region extends between the first and second source/drain regions. An insulated gate electrode surrounds the channel region.

14 Claims, 25 Drawing Sheets

GATE-ALL-AROUND INTEGRATED CIRCUIT DEVICES

CROSS-REFERENCE TO RELATED APPLICATION

This application is a continuation of U.S. patent application Ser. No. 11/374,644 filed on Mar. 13, 2006 now U.S. Pat. No. 8,129,800 which is related to and claims priority from Korean Patent Application No. 10-2005-0079958, filed on Aug. 30, 2005, in the Korean Intellectual Property Office, the disclosures of which are hereby incorporated by reference herein in their entireties.

BACKGROUND OF THE INVENTION

The present invention relates to integrated circuit devices and methods of manufacturing the same, and more particularly to gate all-around devices with a gate electrode encircling a channel region and methods of manufacturing the same.

Integrated circuit (semiconductor) devices, such as field effect transistors, are widely used in logic, memory, processor and other integrated circuit devices. As is well known to those having skill in the art, an integrated circuit field effect transistor includes spaced apart source and drain regions, a channel therebetween and a gate electrode adjacent the channel. Integrated circuit field effect transistors are often referred to as Metal Oxide Semiconductor Field Effect Transistors (MOSFETs) or simply as MOS devices. Although these terms will be used in the present application, they are used to generally denote integrated circuit field effect transistors and are not limited to field effect transistors having metal gates or oxide gate insulators.

As the integration density of integrated circuit field effect transistors continues to increase, the size of the active region and the channel length may continue to decrease. With the reduction in the channel length of the transistor, the influence of the source/drain upon the electric field or potential in the channel region may become considerable. This is typically called the "short channel effect." Further, with the scaling down of the active size, the channel width typically decreases, which may increase a threshold voltage. This is generally called the "narrow width effect".

In order to limit or prevent the short channel effect, various types of FETs have been proposed. Examples of transistor device designs directed to the short channel effect in highly integrated devices include a recessed channel array transistor (RCAT), a fin-shaped FET (FinFET) and a gate-all-around transistor (GAAT). These types of FETs are described, for example, in U.S. Patent Application No. 2004/0063286.

However, a GAAT typically has a gate electrode formed using a contact-shaped pattern or bar-shaped pattern. As design rules are being decreased, it may be difficult to fabricate such contact-shaped or bar-shaped gate electrodes on an integrated circuit (semiconductor) substrate. Moreover, an overlap margin may not be sufficiently secured during photolithography operations used when forming the gate electrode. In addition, a leakage current between the substrate and the source/drain regions may not be sufficiently limited.

SUMMARY OF THE INVENTION

Some embodiments of the present invention provide gate-all-around integrated circuit devices include first and second source/drain regions on an active area of an integrated circuit substrate. The first and second source/drain regions form p-n rectifying junctions with the active area. A channel region extends between the first and second source/drain regions. An insulated gate electrode surrounds the channel region.

In other embodiments, a device isolating layer is provided on the integrated circuit substrate and the active area is a linearly extending shaped region that extends through the device isolating layer and the first and second source/drain regions are positioned on linearly displaced portions of the active region. An insulating region may extend through the active area under the linearly displaced portions of the active region. A thickness of the insulating region may be about 10 nm to about 40 nm. An upper surface of the insulating region may be lower than an upper surface of the device isolating layer and a portion of the active area may extend between the upper surface of the insulating region and the first and second source/drain regions.

In further embodiments, the integrated circuit substrate comprises single-crystalline silicon or Silicon-On-Insulator (SOI). The channel region may be single-crystalline silicon. The first and second source/drain regions may be single-crystalline silicon. An upper surface of the channel region may be substantially level with an upper surface of the first and second source/drain regions. A thermal silicon oxide gate insulating layer may be provided between the gate electrode and the channel region and between the gate electrode and the active area of the integrated circuit substrate. A thickness of the gate insulating layer may be from about 50 Å to about 100 Å.

In other embodiments, the gate electrode is a polysilicon layer, a composite layer including a polysilicon layer and a conductive material layer having a sheet resistivity less than that of the polysilicon layer, a single refractory metal layer and/or a composite layer of refractory metals. The gate electrode may be impurity-doped polysilicon, metal silicide and/or a composite layer including impurity-doped polysilicon.

In further embodiments of the present invention, a gate-all-around integrated circuit device includes an integrated circuit substrate having an active region and first and second source/drain regions on the active region, the first and second source/drain regions being separated from each other. A channel region extends between the first and second source/drain regions and a partial insulating region extends under the first and second source/drain regions. A gate electrode surrounds the channel region and extends through the partial insulating region. A first gate insulating layer is provided between the gate electrode and the channel region and a second gate insulating layer is provided between the gate electrode and the active region.

In yet other embodiments, a device isolating layer is provided on the integrated circuit substrate and the active area is a linearly extending shaped region that extends through the device isolating layer and the first and second source/drain regions are positioned on linearly displaced portions of the active region with the partial insulating region therebetween. The integrated circuit substrate may be single-crystalline silicon or Silicon-On-Insulator (SOI). A thickness of the partial insulating region may be about 10 nm to about 40 nm. The partial insulating region may have an upper surface level with an upper surface of the device isolating layer.

In other embodiments, the channel region is single-crystalline silicon. The first and second source/drain regions may be single-crystalline silicon. An upper surface of the channel region may be substantially level with an upper surface of the first and second source/drain regions. The first gate insulating layer may be a thermal silicon oxide and a thickness of the first gate insulating layer may be from about 50 Å to about 100 Å. The gate electrode may be a polysilicon layer, a composite layer including a polysilicon layer and a conductive material layer having a sheet resistivity less than that of the polysilicon layer, a single refractory metal layer and/or a composite layer of refractory metals. The gate electrode may be impurity-doped polysilicon, metal silicide and/or a composite layer including impurity-doped polysilicon.

In further embodiments, methods of manufacturing a gate-all-around semiconductor include forming a device isolating layer to define an active region in a semiconductor substrate and forming a first mask layer including an opening extending across and exposing a portion of the device isolating layer and an intermediate portion of the active region where a gate electrode will be formed. A SiGe epitaxial layer is formed on the exposed portion of the active region. A first Si epitaxial layer is formed on the SiGe layer. A second mask layer is formed covering the Si epitaxial layer and the exposed portion of the device isolating layer. The first mask layer is removed to expose linearly displaced portions of the active region where source and drain regions, respectively, will be formed. A second Si epitaxial layer is formed on the exposed portions of the active region to provide the source and drain regions. The second epitaxial layer abuts the SiGe epitaxial layer and the first Si epitaxial layer. The SiGe epitaxial layer is removed while retaining the first Si epitaxial layer as a channel region bridging between the source and drain regions and a gate electrode is formed surrounding the channel region.

In other embodiments, forming the SiGe epitaxial layer and forming the first Si epitaxial layer include growing a stacked structure including a plurality of alternating SiGe and Si epitaxial layers and the gate electrode surrounds the channel region and extends linearly along the gate electrode between the source and drain regions.

In some embodiments, forming the device isolating layer includes forming a photoresist pattern to define the active region on the semiconductor substrate, removing portions of the semiconductor substrate using the photoresist pattern to form a recess region and filling the recess region with a buried material layer to form the device isolating layer. Forming the first mask layer may include forming a first mask forming material layer covering the first active region and the device isolating layer, forming a photoresist pattern to define the opening and removing a portion of the first mask forming material layer using the photoresist pattern defining the opening as an etch mask to expose the portion of the device isolating layer and the intermediate portion of the active region. The first mask layer may be a nitride layer and an oxide layer and the nitride layer may be etch selective to the device isolating layer. A width of the opening in the first mask layer may be selected to provide a desired width of the gate electrode.

In further embodiments, the first SiGe epitaxial layer is formed using $SiH_4$, $SiH_2Cl_2$, $SiCl_4$ and/or $Si_2H_6$ as an Si source gas and $GeH_4$ as a Ge source gas. The first and second Si epitaxial layers may be formed using $SiH_4$, $SiH_2Cl_2$, $SiCl_4$ and/or $Si_2H_6$ as a source gas. Forming the second mask layer may include forming a mask forming material layer covering the stacked SiGe epitaxial layer and first Si epitaxial layer and covering the portion of the device isolating layer exposed by the first mask layer and removing the first mask layer while leaving the mask forming material layer to define the second mask layer and to expose the portions of the active region where the source and drain regions will be formed and portions of the device isolating layer.

In other embodiments, the second mask layer is etch selective to the first mask layer. Upper surfaces of the second mask layer and the first mask layer may be substantially level with each other. Upper surfaces of the first Si epitaxial layer and the second Si epitaxial layer may be substantially level with each other. Forming the second Si epitaxial layer may be followed by ion implanting an impurity into the second Si epitaxial layer to define a conductivity type of the source and drain regions.

In yet other embodiments, removing the SiGe epitaxial layer includes forming a third mask layer having an upper surface substantially level with an upper surface of the second mask layer, removing the second mask layer to expose the stacked SiGe epitaxial layer and first Si epitaxial layer and to expose a portion of the first device isolating layer and removing the first SiGe epitaxial layer to expose the active region. The third mask layer may be etch selective to the second mask layer. Removing the SiGe epitaxial layer may include removing the SiGe epitaxial layer by wet etching and/or chemical dry etching. When removing the SiGe epitaxial layer, an etch selectivity of the SiGe epitaxial layer and the first Si epitaxial layer may be greater than 30. The SiGe epitaxial layer may be removed using a mixture of $H_2O_2$, HF and $CH_3COOH$, a mixture of $NH_4OH$, $H_2O_2$ and $H_2O$, and/or an etchant comprising peracetic acid. Forming the gate electrode may be preceded by annealing the exposed first Si epitaxial layer to form a gate insulating layer on the channel region and forming the gate electrode may include forming the gate electrode with the gate insulating layer between the gate electrode and the channel region.

In further embodiments, forming the device isolating layer includes forming a sacrificial layer on the semiconductor substrate and forming an opening in the sacrificial layer extending to the semiconductor substrate. A third Si epitaxial layer is formed on the sacrificial layer and in the opening, the third Si epitaxial layer contacting the semiconductor substrate. A photoresist pattern is formed to define the active region on the semiconductor substrate. Portions of the semiconductor substrate are removed using the photoresist pattern to form a recess region. The sacrificial layer is removed to form a partial insulating region under where the source and drain regions will be formed and the recess region and the partial insulating region are filled with an insulating material layer to form the device isolating layer and to define the active region.

In other embodiments forming the device isolating layer includes selectively growing a SiGe preliminary layer and a first Si preliminary layer that cover an entire surface of the semiconductor substrate. The SiGe preliminary layer and the first Si preliminary layer are partially removed to expose the active region where the gate electrode will be formed. A second Si preliminary layer is formed by further growing the first Si preliminary layer and filling up the exposed portion. A photoresist pattern is formed to define second device isolating layer. The second Si preliminary layer, the SiGe preliminary layer, and the semiconductor substrate are removed to form the recess region, using the photoresist pattern as an etch mask. The SiGe preliminary layer is removed and the device isolating layer buried within the recess region is formed including being filled into the partial insulating layer where the SiGe preliminary layer is removed. The partial insulating region may be as thick as the SiGe preliminary layer.

In yet further embodiments, forming a second Si expitaxial layer includes forming a third Si epitaxial layer on the second Si epitaxial layer to provide the source and drain regions. Forming the device isolating layer includes forming a partial insulating region on a lower surface of the third Si epitaxial layer and forming a device isolating layer filled into the partial insulating layer to define the active region. Forming the first mask layer may include forming a first mask forming material layer that covers the third Si epitaxial layer and the device isolating layer, forming a second photoresist pattern to define the first mask layer that partially exposes to linearly extend the second active region and the second device isolating layer where the gate electrode will be formed and forming the first mask layer by removing the first mask forming material layer, using the second photoresist pattern as an etch mask.

In other embodiments, forming the second mask layer includes forming a second mask forming material layer that covers the stacked structure of the SiGe epitaxial layer and the first Si epitaxial layer, and the second device isolating layer exposed by the first mask layer and forming the second mask layer that exposes the source and drain regions and a portion of the device isolating layer by removing the first mask layer. Removing the SiGe epitaxial layer may include removing the second mask layer to expose the stacked structure of the SiGe epitaxial layer and the first Si epitaxial layer, and the second device isolating layer and removing the SiGe epitaxial layer to expose the second active region.

In further embodiments, methods of manufacturing a gate-all-around semiconductor device include forming a partial insulating region on a lower surface of a Si epitaxial layer defining source and drain regions in an active region of the semiconductor device and forming a device isolating layer defining the active region of the semiconductor device, including filling the partial insulating region with the device isolating layer. A mask layer is formed that includes an opening that exposes a portion of the active region where a gate electrode will be formed and a portion of the device isolating layer. A SiGe epitaxial layer is formed on the exposed portion of the active region and the Si epitaxial layer defining the source and drain regions is further grown, including forming, on the SiGe epitaxial layer, a channel region extending between the source and the drain regions. The SiGe epitaxial layer is removed after further growing the Si epitaxial layer and a gate electrode is formed surrounding the channel region.

In other embodiments, forming the mask layer includes forming a mask forming material layer that covers the Si epitaxial layer and the device isolating layer, forming a photoresist layer pattern on the mask forming material layer that defines the opening of the mask layer and forming the fourth mask layer by removing the fourth mask forming material layer using the photoresist pattern as an etch mask. Forming the SiGe epitaxial layer may include forming the third Si epitaxial layer to a substantially same level as the Si epitaxial layer. Further growing the Si epitaxial layer may include removing the fourth mask layer to expose an upper surface of the Si epitaxial layer and the SiGe epitaxial layer and further growing the Si epitaxial layer on the exposed upper surface of the SiGe epitaxial layer and the Si epitaxial layer.

In yet other embodiments, further growing the Si epitaxial layer is followed by ion implanting an impurity into the Si epitaxial layer to define a conductivity type of the source and drain regions. Removing the SiGe epitaxial layer may be preceded by removing an upper surface of the device isolating layer to provide substantially level upper surfaces of the partial insulating region and the device isolating layer. Forming the gate electrode may be preceded by partially annealing the Si epitaxial layer to form a gate insulating layer surrounding the channel region.

BRIEF DESCRIPTION OF THE DRAWINGS

The above and other features and advantages of the present invention will become more apparent by describing in detail exemplary embodiments thereof with reference to the attached drawings in which:

FIGS. 1A through 11A are perspective views illustrating a method of manufacturing a gate-all-around integrated circuit (semiconductor) device according to a some embodiments of the present invention.

FIGS. 1B through 11B are cross-sectional views taken along a line A-A (shown in FIG. 1A) of FIGS. 1A-11A, respectively.

FIGS. 12A through 17A are perspective views illustrating a method of manufacturing a gate-all-around integrated circuit (semiconductor) device according to other embodiments of the present invention.

FIGS. 12B through 17B are cross-sectional views taken along a line A-A (shown in FIG. 1A) of FIGS. 12A-17A, respectively.

FIGS. 18A through 25A are perspective views illustrating a method of manufacturing a gate-all-around integrated circuit (semiconductor) device according to further embodiments of the present invention.

FIGS. 18B through 25B are cross-sectional views taken along a line A-A (shown in FIG. 1A) of FIGS. 18A-25A, respectively.

DETAILED DESCRIPTION OF EMBODIMENTS OF THE INVENTION

Figure 1A:
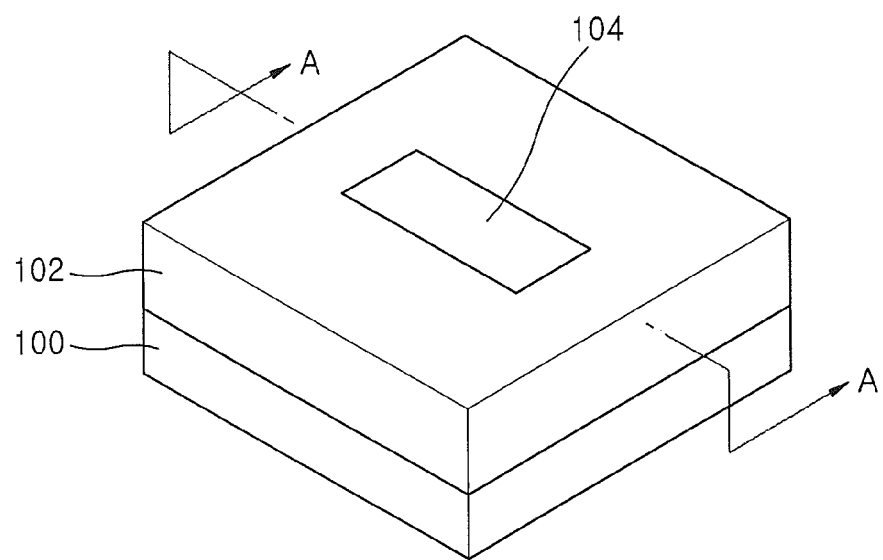

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence, of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention will now be described with reference to the figures. FIGS. 1A through 11A are perspective views illustrating a method of manufacturing a gate-all-around semiconductor device according to some embodiments of the present invention. FIGS. 1B through 11B are cross-sectional views taken along a line A-A (shown in FIG. 1A) of FIGS. 1A-11A, respectively.

Figure 1B:
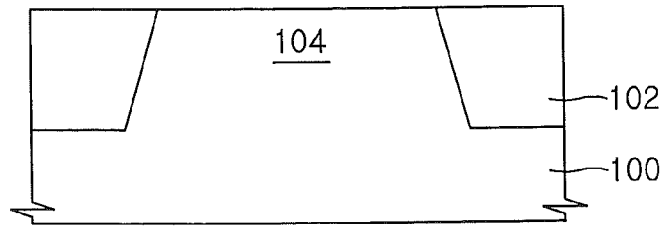

Referring first to FIGS. 1A and 1B, a first device isolating layer 102 defining a first active region 104 is formed on an integrated circuit (semiconductor) substrate 100. The semiconductor substrate 100 may be a semiconductor material, such as single-crystalline silicon. For example, the semiconductor substrate 100 may be a bulk silicon or a Silicon-On-Insulator (SOI) structure. To form the first device isolating layer 102, a mask layer, for example, having a pad oxide layer and a pad nitride layer, is formed on the semiconductor substrate 100 using photolithography or the like to define the first device isolating layer 102. The pad oxide layer may decrease stress between the semiconductor substrate 100 and the nitride layer and may have a thickness of 20~100 Å and, in some embodiments, may be about 100 Å. The nitride layer may be used as a hard mask for etching a region where the first device isolating layer 102 will be formed, and may be formed by depositing silicon nitride to a thickness of 500~2,000 Å. In some embodiments, the nitride layer may have a thickness of about 800~850 Å. The deposition method used may be, for example, Chemical Vapor Deposition (CVD), Sub-Atmospheric CVD (SACVD), Low Pressure CVD (LPCVD) and/or Plasma Enhanced CVD (PECVD).

The semiconductor substrate 100 is etched to a predetermined depth using the mask layer as an etch mask, for example, by anisotropic dry etching. A buried material layer is filled into the region where the first device isolating layer 102 is to be formed. The buried material layer may be an insulating layer, which may be selected from a group consisting of an USG layer, an HDP oxide layer, a TEOS layer formed using PECVD, an oxide layer using PECVD, and a combination of these materials. In some embodiments the buried material layer is an HDP oxide layer. The HDP oxide layer may have a dense film quality and a good gap fill characteristic.

Figure 2A:
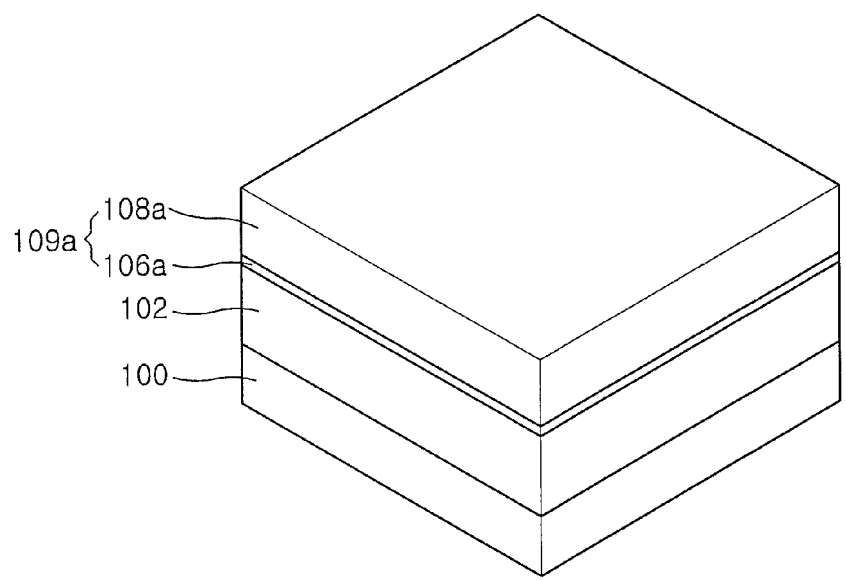
Figure 2B:
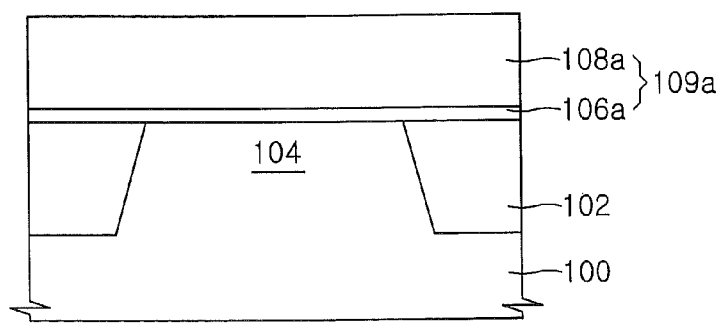

As seen in the embodiments of FIGS. 2A and 2B, a first mask forming material layer 109a is formed on the entire surface of the semiconductor substrate 100 in the region including the first active region 104. The first mask forming material layer 109a may have a stacked structure including a silicon nitride layer 106a and a silicon oxide layer 108a. The silicon nitride layer 106a may be an etch stop layer having an etch selectivity to the material of the first device isolating layer 102. The silicon nitride layer 106a may be formed using a method such as CVD, SACVD, LPCVD and/or PECVD. The silicon nitride layer 106a may have a thickness selected so as not to damage a second mask layer 116 (FIG. 6A) when the first active region 104 is exposed by the second mask layer 116.

The silicon oxide layer 108a used for forming a first mask layer (109 of FIG. 3A) according to some embodiments of the present invention may be formed using a method such as CVD, SACVD, LPCVD and/or PECVD. The silicon oxide layer 108a may play a role in determining a thickness of a subsequently formed gate electrode (126 of FIG. 11B) as will be described further herein. The silicon oxide layer 108a may be deposited to a thickness of 2,000~6,000 Å and, in some embodiments, may have a thickness of 3,500~4,500 Å.

Figure 3A:
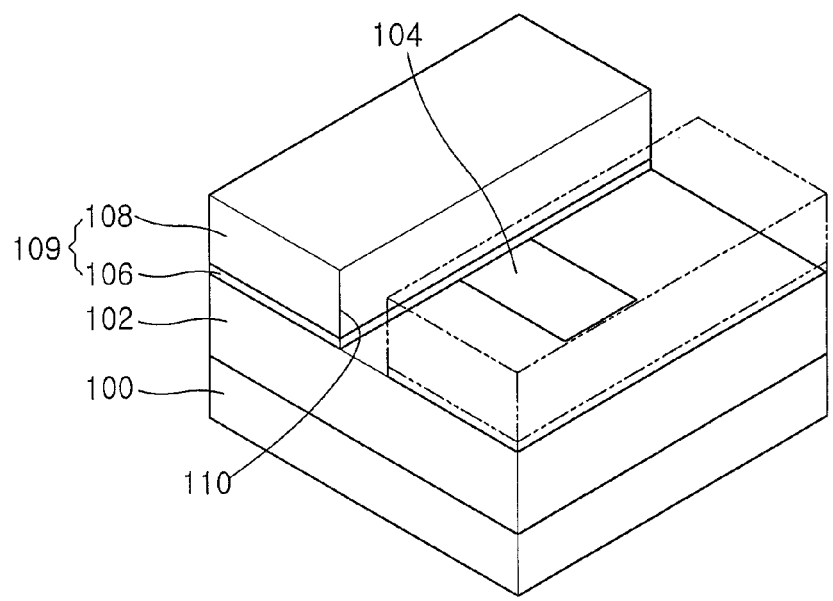
Figure 3B:
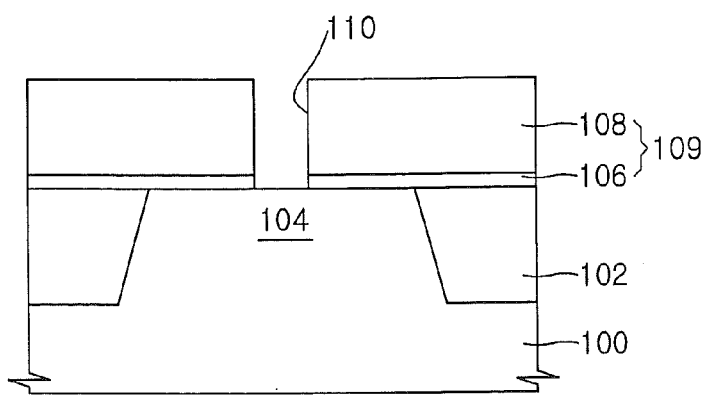

Referring to FIGS. 3A and 3B, a first mask layer 109 is shown formed to partially expose the first active region 104 and the first device isolating layer 102, thereby forming a linearly shaped first opening 110 where the gate electrode may be formed as will be described herein. When forming the first mask layer 109, a photoresist pattern may be formed to define the first mask layer 109 on the first mask forming material layer 109a. The first mask forming material layer 109a may be partially removed by, for example, anisotropic dry etching using the photoresist pattern as an etch mask, to form the first mask layer 109.

A width in an elongated direction of the first active region 104 opened by the first mask layer 109 may be the same as a width of the gate electrode (126 of FIG. 11B) formed later therein. The first mask layer 109 may be formed to extend from one end to the other end of an area of the semiconductor substrate 100 where a plurality of the first active regions 104 are arranged. For example, an array formed by the plurality of the first active regions 104 may extend from one end to the other end of a cell region. The first active regions 104 may be diversely arranged, such as in a linear form and/or a zigzag form.

The linearly-shaped first mask layer 109 may further increase a processing margin for forming the gate electrode compared to a conventional contact-shaped or bar-shaped mask pattern. An increase of the processing margin can enlarge a wavelength of a light source used for exposure operations selected to provide a desired increased integration density or may allow for use of an exposure process with a conventional light source without increasing the number of the apertures used. Accordingly, the linearly shaped first mask layer 109 may be provide for fabrication of a further miniaturized pattern. Also, because the linear form may inhibit striation produced when forming the gate electrode, no hard mask may be required for removing the striation.

Figure 4A:
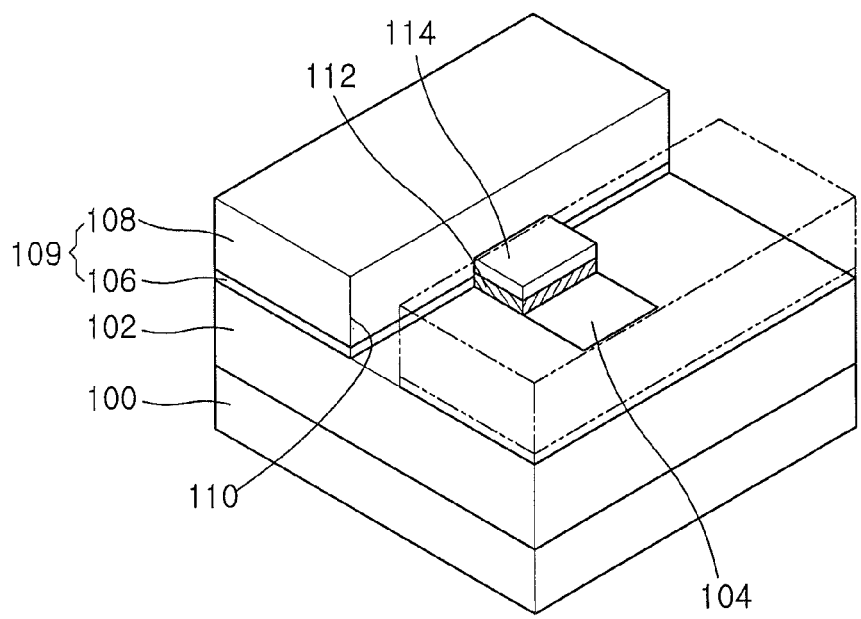
Figure 4B:
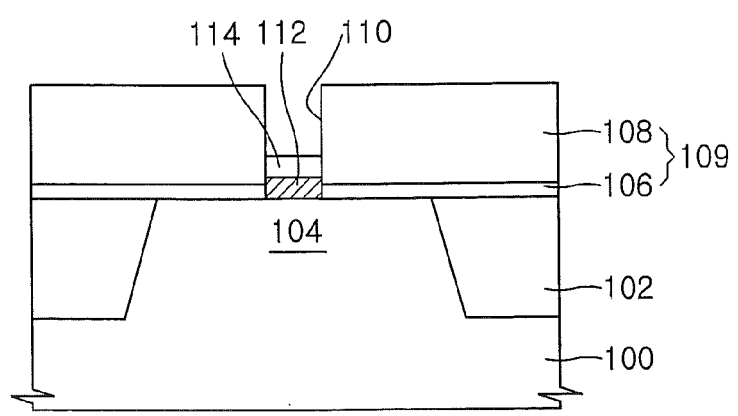

Referring now to FIGS. 4A and 4B, a stacked structure is shown including a first SiGe epitaxial layer 112 (which may be referred to herein as a "first SiGe layer") and a first Si epitaxial layer 114 (which may be referred to herein as a "first Si layer") is formed on the first active region 104 in the first opening 110. The stacked structure may include a plurality of alternating SiGe and Si layers. The first Si layer 114 may define a channel layer that forms a channel in a gate-all-around transistor as will be described further herein.

The first SiGe layer 112 may be formed using epitaxy. In order to grow the first SiGe layer 112, $SiH_4$, $SiH_2Cl_2$, $SiCl_4$ and/or $Si_2H_6$ may be used as a Si source gas, and $GeH_4$ gas may be used as a Ge source gas in some embodiments of the present invention. The first SiGe layer 112 may have 10~30% of Ge density. If the stacked structure consists of at least two pairs of alternating layers, respective first SiGe layers 112 may have a predetermined thickness selected based on a desired thickness of respective first Si layers 114. For example, the first SiGe layers 112 may have a thickness of about 10~40 nm, respectively, in some embodiments.

In some embodiments, the first SiGe layer 112 may be epitaxially grown to a thickness less than roughly 30 nm. The first SiGe layer 112 can be grown to a thickness greater than about 50 nm, for example, by decreasing the density of Ge in a layer of, for example, $Si_{0.8}Ge_{0.2}$, but such a thickness may impede the provision of etch selectivity. Moreover, a layer thicker than about 30 nm may be more likely to cause dislocation. The first SiGe layer 112 may be formed of $Si_{0.7}Ge_{0.3}$ and may be formed to a thickness of less than about 30 nm. In some embodiments, the first SiGe layer 112 has a thickness of about 25 nm.

The first Si layer 114 may also be formed using epitaxy. In order to form the first Si layer 114, $SiH_4$, $SiH_2Cl_2$, $SiCl_4$ and/or $Si_2H_6$ gas may be used as an Si source gas. The first Si layer 114 may be formed to a predetermined thickness based on a desired dimension of the channel in the gate-all-around transistor. In some embodiments, a desired thickness of the channel section is about 10~30 nm and the first Si layer 114 may be about 15~40 nm, which is slightly greater than the desired thickness of the channel section.

Figure 5A:
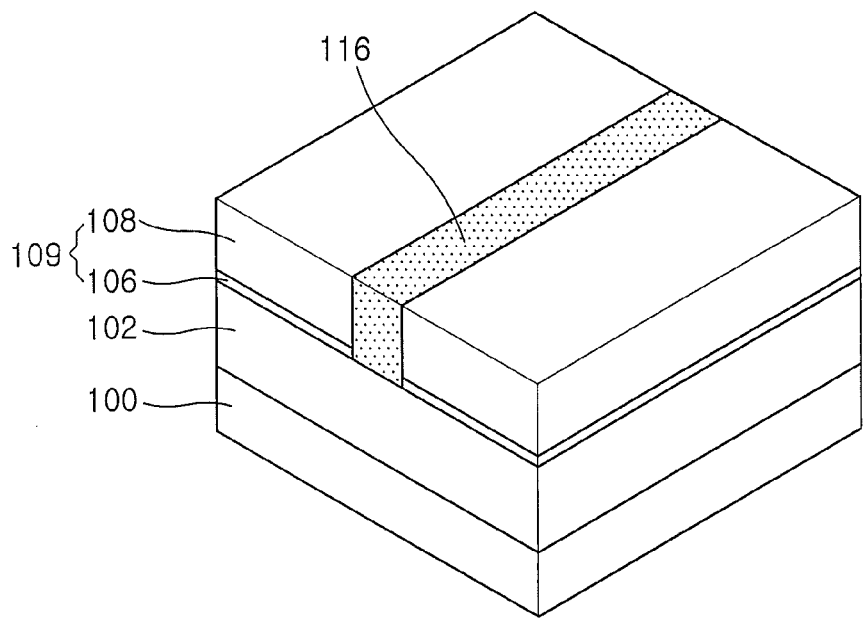
Figure 5B:
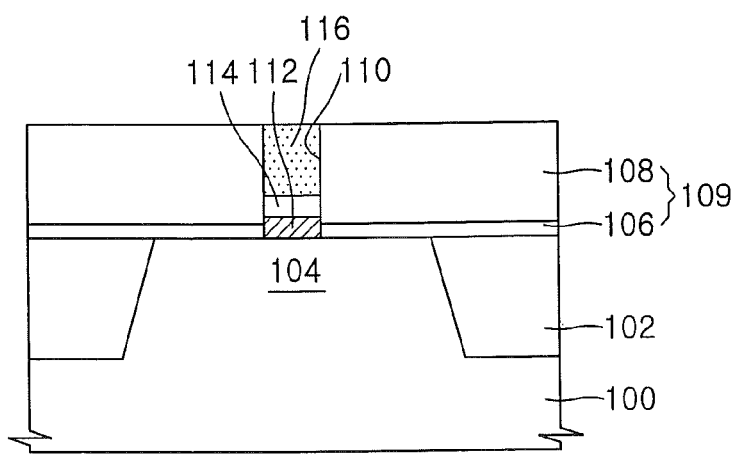

Referring now to FIGS. 5A and 5B, a second mask layer 116 is formed that covers the stacked structure and the exposed region of the first device isolating layer 102. The second mask layer 116 may be etch selective to the silicon oxide layer 108 that forms the first mask layer 109. The second mask layer 116 may be a nitride layer formed by, for example, CVD, SACVD, LPCVD and/or PECVD. The second mask layer 116 in the illustrated embodiments has an upper surface profile substantially similar to and planar with the upper surface of the silicon oxide layer 108.

Figure 6A:
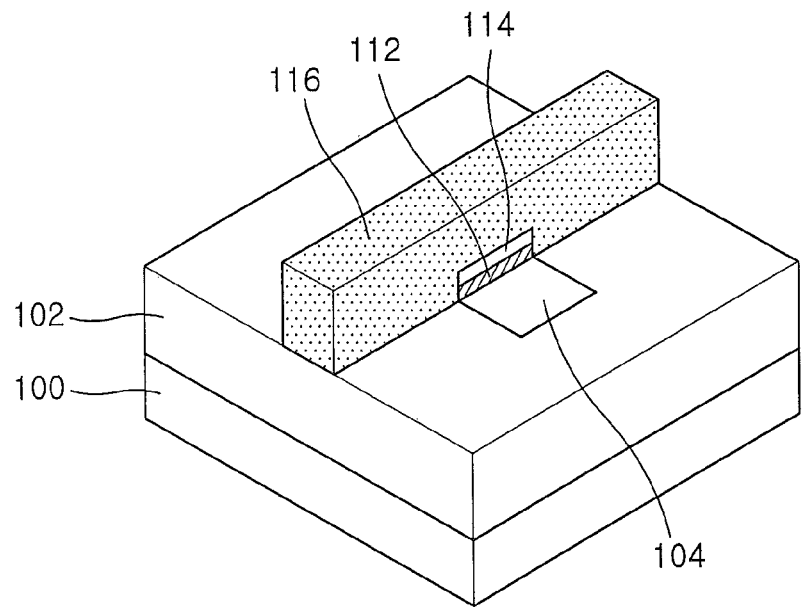
Figure 6B:
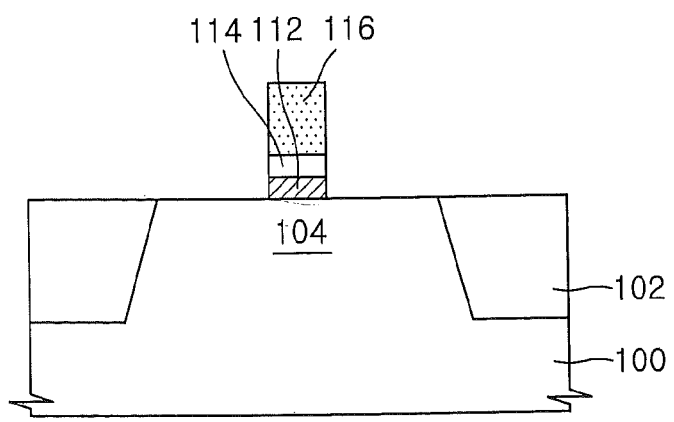

Referring to FIGS. 6A and 6B, the first mask layer 109 is removed to expose the first active region 104, where source/drain regions S/D will be formed. Note that, as used herein, "source/drain regions" refers to respective regions of a transistor device that may be configured used as a source region or a drain region, depending upon how the respective regions are coupled to other device elements of the integrated circuit device. Accordingly, a pair of source/drain regions coupled by a channel region extending therebetween may also be referred to herein as a source region and a drain region. The silicon oxide layer 108 may be removed using, for example, isotropic wet etching, using diluted HF, $NH_4F$ and/or Buffered Oxide Etchant (BOE) that is a mixture of HF and deionized water. The silicon nitride layer 106 may be removed using anisotropic dry etching.

Figure 7A:
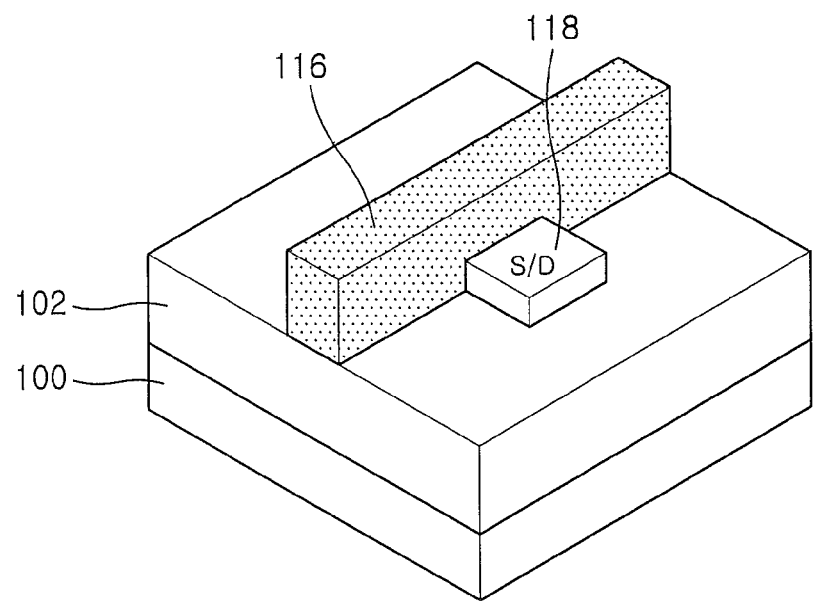
Figure 7B:
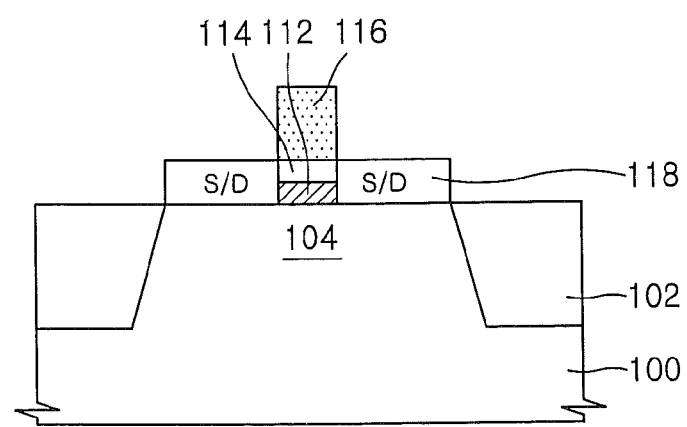

Referring next to FIGS. 7A and 7B, a second Si epitaxial layer 118 (which may be referred to herein as a "second Si layer") is shown formed on the exposed source/drain regions S/D. The second Si layer 118 may be formed using epitaxy. In forming the second Si layer 118, $SiH_4$, $SiH_2Cl_2$, $SiCl_4$ and/or $Si_2H_6$ may be used as Si source gas. The second Si layer 118 may be as thick as the stacked structure 112, 114). In other words, upper surfaces of the second Si layer 118 and the first Si layer 114 may be level with each other.

The second Si layer 118 may be ion implanted with an impurity, for example, B or $BF_2$. As the ion implantation may be restricted to the second Si layer 118, ion implantation efficiency may be enhanced. The ion implanting may be used to define a conductivity type of the source and drain regions. As seen in FIGS. 7A and 7B, the source/drain regions S/D in the illustrated embodiments form p-n rectifying junctions with the active area 104.

Figure 8A:
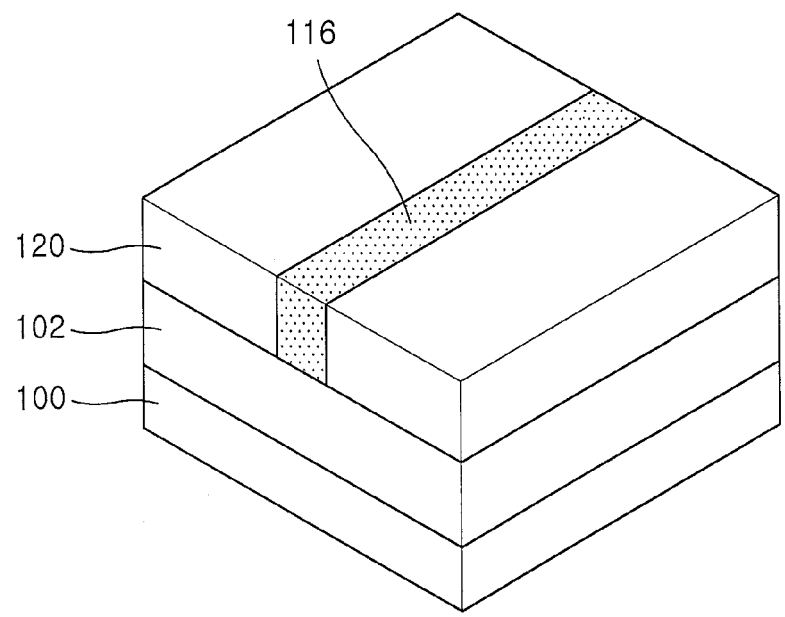
Figure 8B:
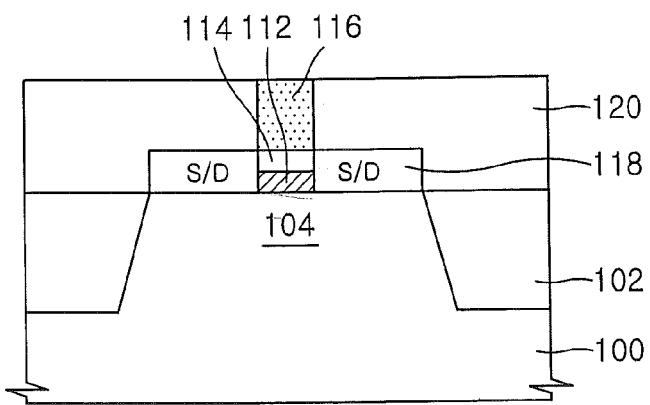

As seen in the embodiments of FIGS. 8A and 8B, a third mask layer 120 is formed on the entire surface of the semiconductor substrate 100 including the second Si layer 118, for example, using CVD. The third mask layer 120 may be planarized to be level with the upper surface of the second mask layer 116, using, for example, Chemical Mechanical Polishing (CMP). As such, the second Si layer 118 forming the source/drain regions S/D is covered with the third mask layer 120. The third mask layer 120 may be etch selective to the second mask layer 116.

Figure 9A:
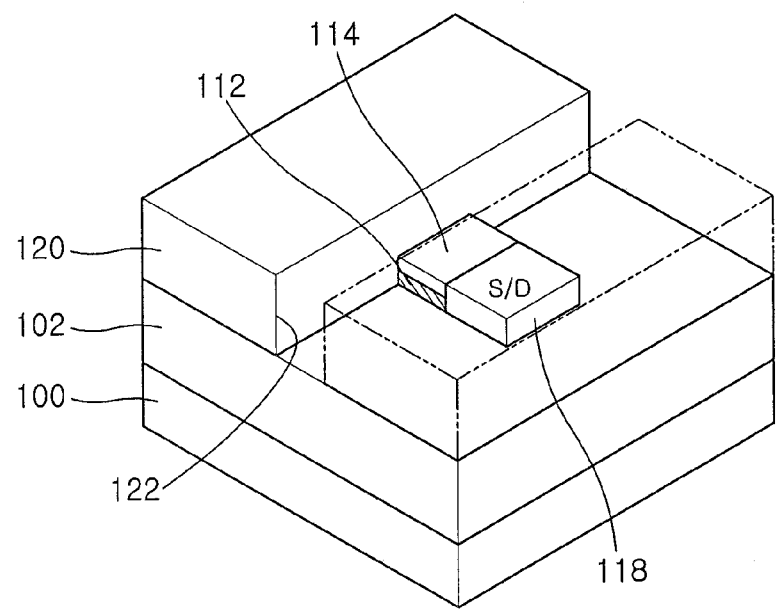
Figure 9B:
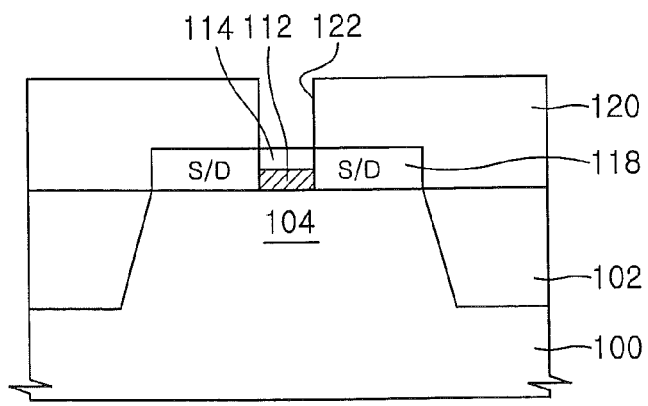

Referring next to FIGS. 9A and 9B, the second mask layer 116 is shown removed to expose the stacked structure formed including at least one pair of the first SiGe layer 112 and the first Si layer 114. The second mask layer 116 may be removed by wet etching using, for example, $H_3PO_4$. As a result, a second opening 122 is formed that exposes the stacked structure, which opening may be used in a subsequent operation to form the gate electrode.

Figure 10A:
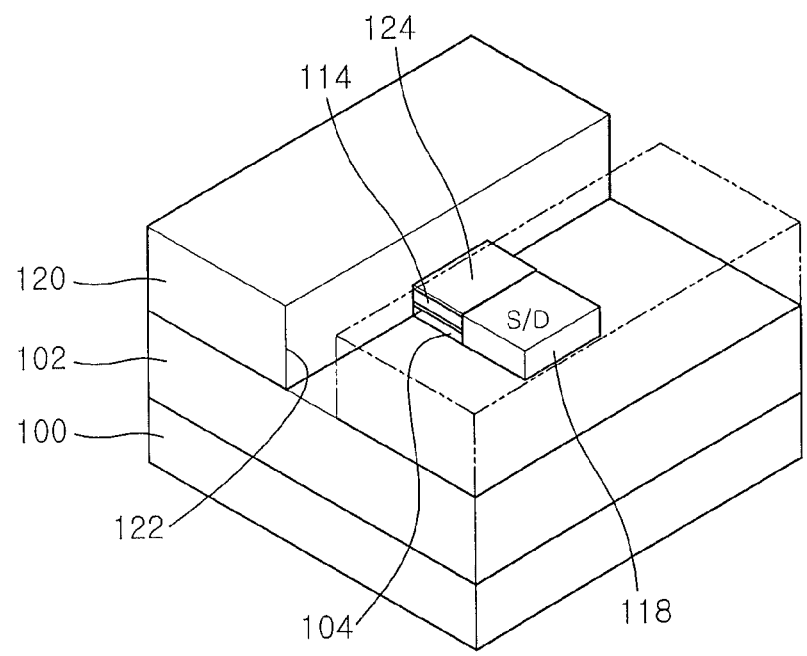
Figure 10B:
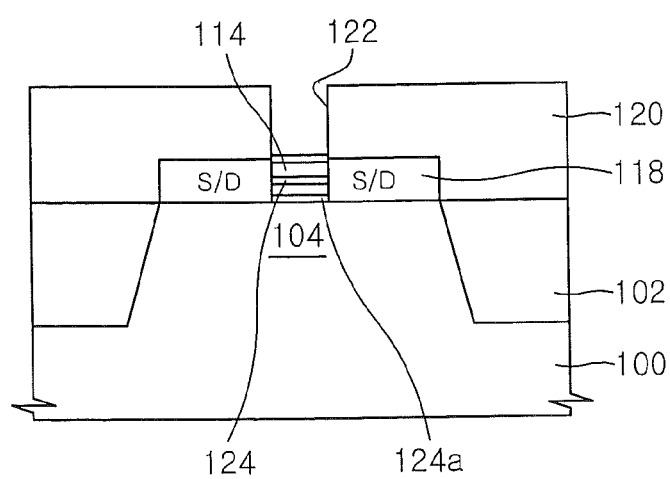

Referring now to the embodiments of FIGS. 10A and 10B, the first SiGe layer 112 exposed by the second opening 122 is removed to expose the first active region 104. The first SiGe layer 112 may be removed, for example, using wet etching and/or chemical dry etching. Etching conditions may be selected so as to make an etch selectivity of the semiconductor substrate 100 and the first Si layer 114 and the first SiGe layer 112 be 30 or greater. For example, when the semiconductor substrate 100, the first Si layer 114, and the first SiGe layer 112 are composed of Si, epitaxial Si and epitaxial SiGe, respectively, a mixture containing $H_2O_2$, HF and $CH_3COOH$, a mixture containing $NH_4OH$, $H_2O_2$ and $H_2O$, and/or an etchant containing peracetic acid may be used.

The first SiGe layer 112 is etched by wet etching rather than chemical dry etching in some embodiments. Additionally, when wet etchant with an etch rate of several hundreds of Å per minute is used, etching time may be significantly decreased. In some embodiments, the wet etchant may be the mixture including $NH_4OH$, $H_2O_2$ and $H_2O$. For example, standard cleaning solution SC-1 in which a mixing ratio of $NH_4OH$, $H_2O_2$ and $H_2O$ is 1:5:1 is used, or the proportion of $H_2O$ is increased, thereby making the mixing ratio 1:5:20. Such a mixture may be particularly effective in removing the first SiGe layer 112 when heated to 40~75° C.

During etching of the first SiGe layer 112 using $NH_4OH$, $H_2O_2$ and $H_2O$, a surface oxide layer may be formed of $H_2O_2$. As $H_2O_2$ may be dissolved into $H_2O$ and O to exert a strong oxidizing force, Si and Ge may be quickly oxidized. In addition, $NH_4OH$ may be dissociated into $NH_4^+$ ions and $OH^-$ ions by the resulting $H_2O$. The $OH^-$ ions may detach Si oxide and Ge oxide of the first SiGe layer 112 from the surface of the first SiGe layer 112, which process may be referred to as lift off by $OH^-$ ions. Furthermore, in order to limit or even prevent re-adsorption of the lifted-off Si oxide and Ge oxide onto the first SiGe layer 112, $OH^-$ ions may be bonded to respective surfaces to provide an electrostatic repulsive force, which process may be referred to as termination by $OH^-$ ions.

Because $H_2O_2$ is an acid solution, its pH may be changed based on a mixing ratio of $NH_4OH$ with respect to $H_2O_2$. The etched quantity of Si and Ge generally varies based on the mixing ratio of $NH_4OH$ and $H_2O_2$, i.e., based on pH variation of the wet etchant used. The mixing ratio in some embodiments is selected to provide a desired etching rate while limiting or even preventing Si pitting. If the etching occurs at a temperature of about 70° C. or more an evaporating speed of $NH_3$ vapor may be increased and an additional supply of ammonia may be used in the etchant under such conditions.

In the first stage of the just described etching process, Ge may be oxidized faster than Si, which in turn may cause faster etching of the Ge. However, the Si—Ge layer remaining after quickly etching Ge from the SiGe layer with Ge and Si may be in an unstable state. As a result, the Si may be more easily damaged by the etchant. Therefore, the etch rate of the first SiGe layer 112 may be greater than the etch rate of the first Si layer 114.

Subsequently, annealing may be performed to form the gate insulating layer 124 on the first Si layer 114. The annealing may be carried out in an oxygen and/or ozone atmosphere to form the gate insulating layer 124 surrounding the first Si layer 114. In addition, a second gate insulating layer 124a may further be formed on the exposed upper surface of the active area 104 as shown in the embodiments of FIG. 10B. The oxidizing of the upper surface of the active area 104 may insulate the subsequently formed gate electrode (126 of FIG. 12B) from the active area 104. When annealing is performed in an oxygen atmosphere, Si exposed on the surface of the first Si layer 114 is oxidized to form a silicon oxide layer on the surface of the first Si layer 114. As the result of annealing, a diameter of the first Si layer 114 is decreased as the oxidized layer is formed. As such, the thickness of the first Si layer 114 when deposited as described with reference to FIGS. 4A and 4B may be selected to account for the decrease in thickness of the Si layer 114 resulting from the later annealing process.

A temperature and time of annealing may be selected based on the desired thickness of the gate insulating layer 124. For example, the annealing may be performed at a temperature and for a time selected to provide a gate insulating layer 124 having a thickness of about 50~100 Å.

Figure 11A:
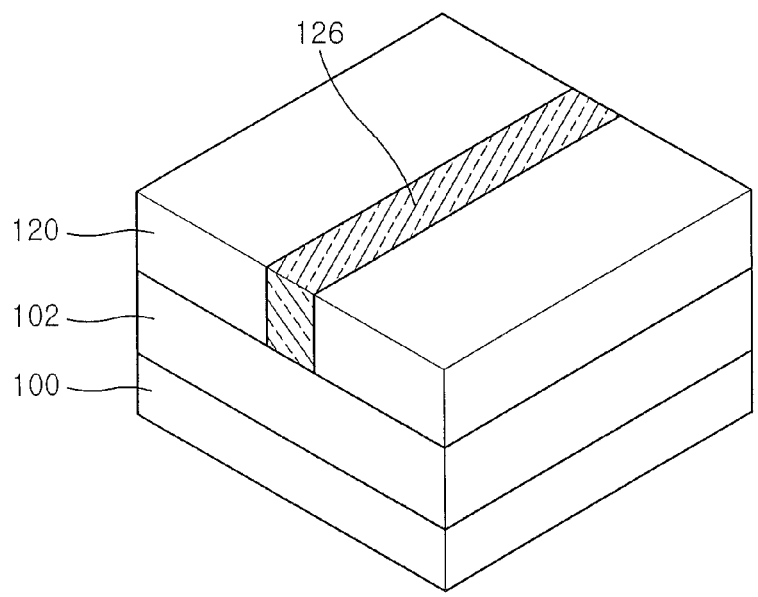
Figure 11B:
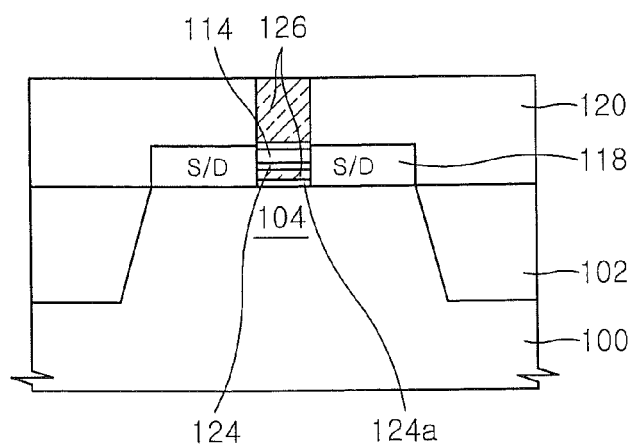

Referring now to the embodiments of FIGS. 11A and 11B, a gate electrode 126 is formed that surrounds the gate insulating layer 124 disposed on the first Si layer 114 between the source/drain regions S/D. The gate electrode 126 may be, for example, a single layer polysilicon layer, a composite layer including polysilicon and a conductive material with a sheet resistivity less than that of polysilicon, a single layer including a refractory metal and/or a composite layer of refractory metals.

Methods of manufacturing a gate-all-around integrated circuit device according to further embodiments of the present invention will now be described with reference to FIGS. 12A-17A and 12B-17B. FIGS. 12A through 17A are perspective views and FIGS. 12B through 17B are cross-sectional views taken along the line A-A (shown in FIG. 1A) of FIGS. 12A through 17B, respectively. The embodiments in these figures differ from those previously described in that a device isolating layer 140 including a partial insulating region 138 is formed on what will be lower surfaces of the source/drain regions S/D (see, e.g. FIG. 16B). Operations for forming a transistor for the embodiments of FIGS. 12A/B through 17A/B (i.e., operations to form the structure of FIGS. 17A and 17B on the structure of FIGS. 16A and 16B) may proceed substantially the same as described previously with reference to FIGS. 2A through 10B. Accordingly, further descriptions of various of such common aspects will be omitted.

Figure 12A:
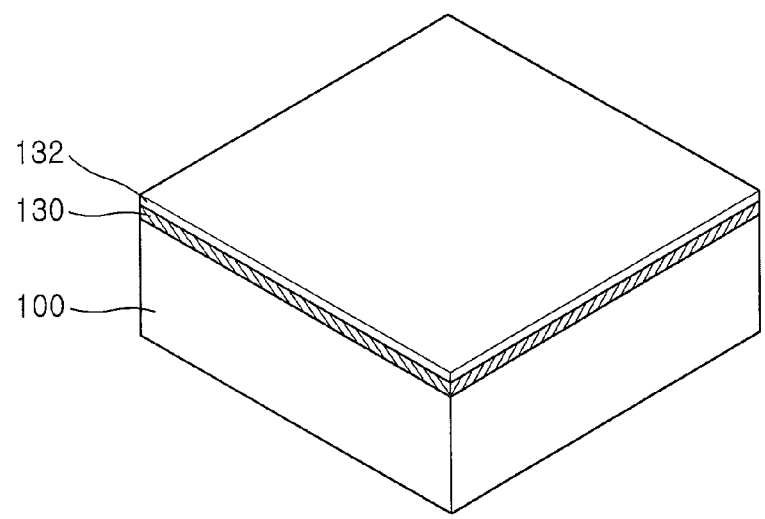
Figure 12B:
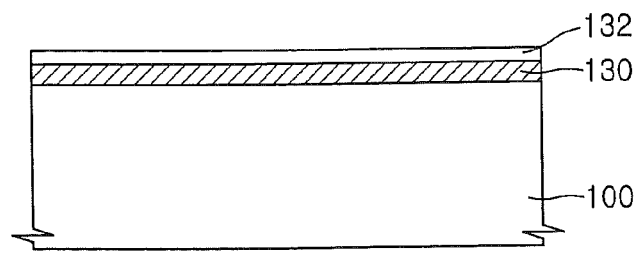
Figure 15A:
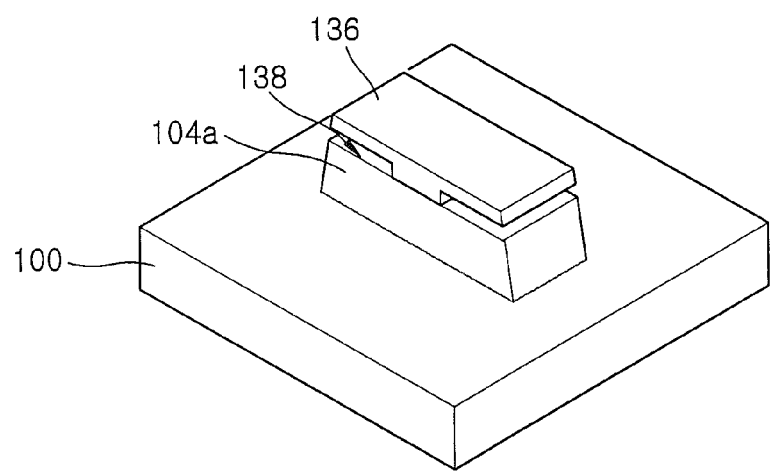

Referring now to FIGS. 12A and 12B, a sacrificial layer, which may be a SiGe preliminary layer 130, and a first Si preliminary layer 132 are formed on a semiconductor substrate 100, for example, by epitaxy. In order to grow the SiGe preliminary layer 130, $SiH_4$, $SiH_2Cl_2$, $SiCl_4$ and/or $Si_2H_6$ may be used as a Si source gas, and $GeH_4$ gas may be used as a Ge source gas. The SiGe preliminary layer 130 may have 10~30% of Ge density. As will be described later herein, the SiGe preliminary layer 130 may be formed to a predetermined thickness based on a desired thickness of a subsequently formed partial insulating region 138 (FIG. 15A). For example, the SiGe preliminary layer 130 may have a thickness of about 10~40 nm in some embodiments.

In particular embodiments, the SiGe preliminary layer 130 may be epitaxially grown to a thickness less than about 30 nm. The SiGe preliminary layer 130 may be grown to a thickness of more than 30 nm and, in some embodiments, may have a thickness greater than about 50 nm and may be a material with a decreased density of Ge, for example, $Si_{0.8}Ge_{0.2}$, but such a greater thickness may impede the provision of a desired etch selectivity. Moreover, a layer thicker than 30 nm may be more likely to cause dislocation. The SiGe preliminary layer 130 may be formed of $Si_{0.7}Ge_{0.3}$ to a thickness of less than about 30 nm, and in some embodiments, to a thickness of about 25 nm.

The first Si preliminary layer 132 may be formed using epitaxy. In order to form the first Si preliminary layer 132, $SiH_4$, $SiH_2Cl_2$, $SiCl_4$ and/or $Si_2H_6$ may be used as Si source gas. As the first Si preliminary layer 132 may be formed on what will be the lower surfaces of the source/drain regions (S/D of FIG. 17A), the first Si preliminary layer 132 may be formed to a thickness selected based on a desired thickness of the source/drain regions S/D.

Figure 13A:
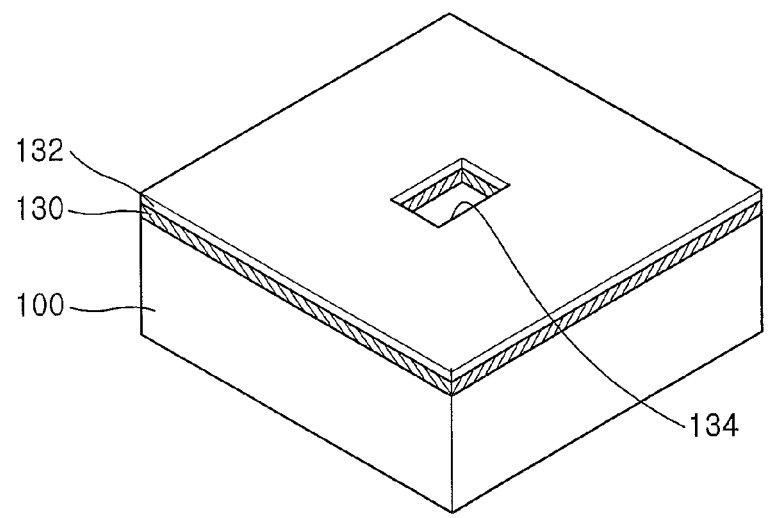
Figure 13B:
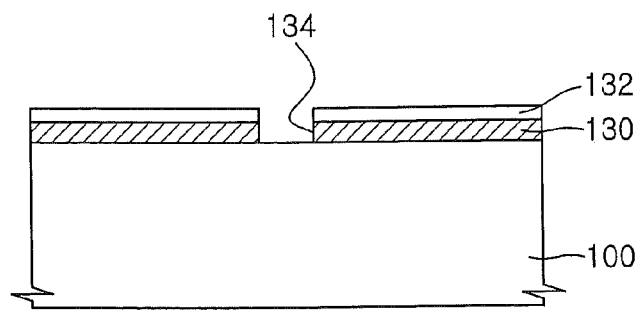

Referring next to the embodiments of FIGS. 13A and 13B, the SiGe preliminary layer 130 and the first Si preliminary layer 132 are partially removed to form a third opening 134 where a gate electrode will be formed. The SiGe preliminary layer 130 and the first Si preliminary layer 132 may be removed by, for example, anisotropic dry etching.

Figure 14A:
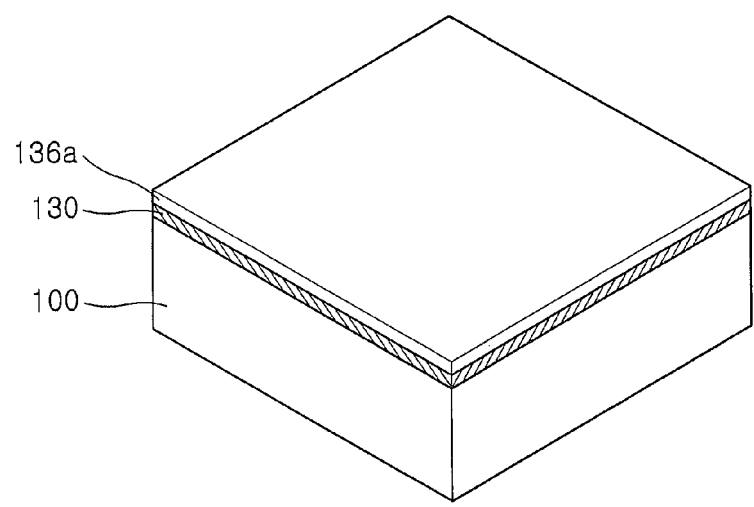
Figure 14B:
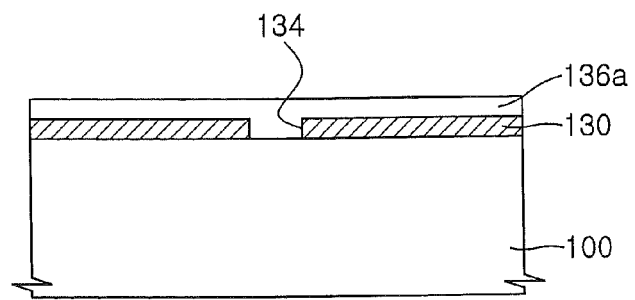

Referring to FIGS. 14A and 14B, a second Si preliminary layer 136a is shown that may be formed by thickening (further growing) the first Si preliminary layer 132 and is further formed to fill the third opening 134. The second Si preliminary layer 136a may be formed using epitaxy. In some embodiments, $SiH_4$, $SiH_2Cl_2$, $SiCl_4$ or $Si_2H_6$ may be used as Si source gas to form the second Si preliminary layer 136a. As the second Si preliminary layer 136a may be formed on what will be the lower surfaces of the source/drain regions (S/D of FIG. 17A), the second Si preliminary layer 136a may be formed to a thickness selected based on a desired thickness of the source/drain regions S/D.

Figure 15B:
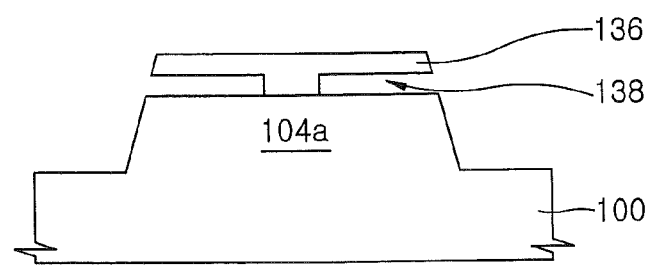

Referring now to FIGS. 15A and 15B, a mask layer for forming a recess region that defines a second active region 104a may be formed on the second Si preliminary layer 136a substantially as described with reference to the previous embodiments. As shown in the embodiments of FIGS. 15A and 15B, using the mask layer as an etch mask, the second Si preliminary layer 136a, the SiGe preliminary layer 130, and the semiconductor substrate 100 are recessed to a predetermined depth by, for example, anisotropic dry etching. As such, a sidewall of the second active region 104a with the SiGe preliminary layer 130 and third Si layer 136 thereon be exposed.

The patterned SiGe preliminary layer 130 may be removed to form a partial insulating region 138 as a recess on and below a lower surface of the third Si layer 136 under a region that will be used in forming the source/drain regions, as seen in the embodiments of FIGS. 15A and 15B. The thickness of the partial insulating region 138 may be determined by the thickness of the SiGe preliminary layer 130. The removal of the SiGe preliminary layer 130 may be performed substantially as described with reference to removal of the SiGe preliminary layer 130 and the first Si preliminary layer 132 as shown in FIG. 13A.

Figure 16A:
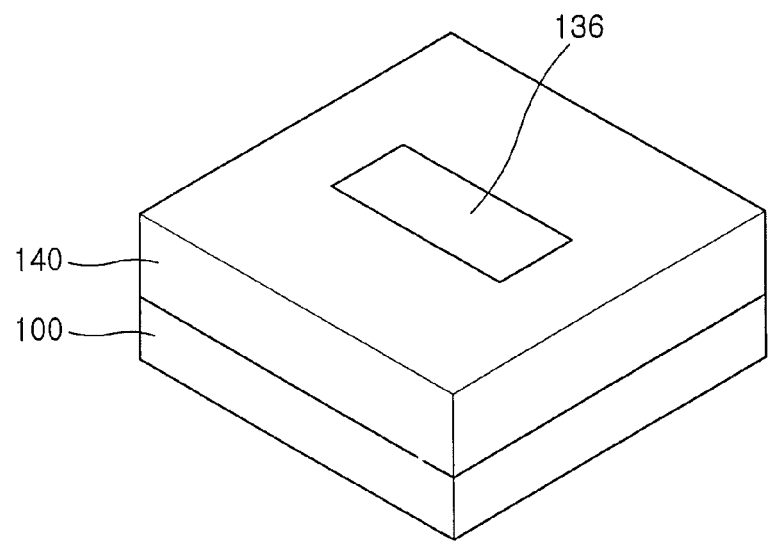
Figure 16B:
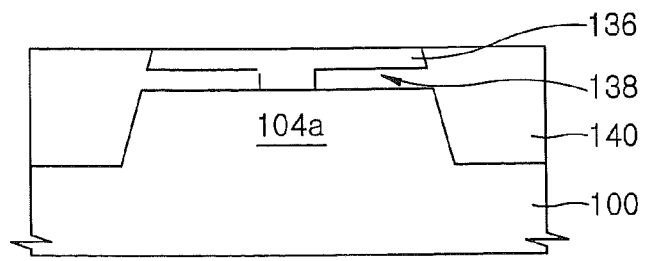

Referring next to FIGS. 16A and 16B, the partial insulating region 138 and the recess region are filled with a buried material layer to form a device isolating layer 140. The buried material layer may be an insulating layer selected from a group consisting of an Undoped Silicate Glass (USG) layer, a High Density Plasma (HDP) oxide layer, a Tetra Ethyl Ortho Silicate (TEOS) layer formed using Plasma Enhanced-Chemical Vapor Deposition (PECVD), an oxide layer using PECVD, and a combination of these materials. In some embodiments, an HDP oxide layer is used that may be more effectively filled into the partial insulating region 138 and the recess region as the HDP oxide layer has a dense film quality and a good gap fill characteristic.

Figure 17A:
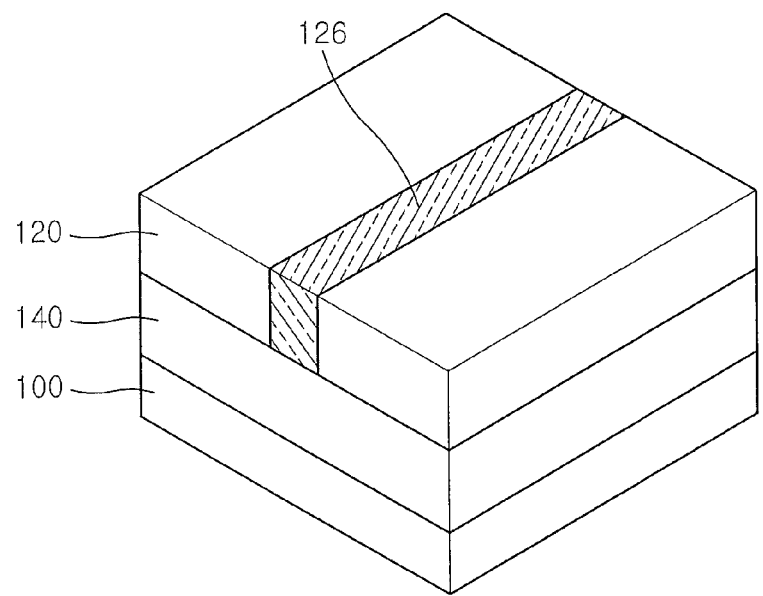
Figure 17B:
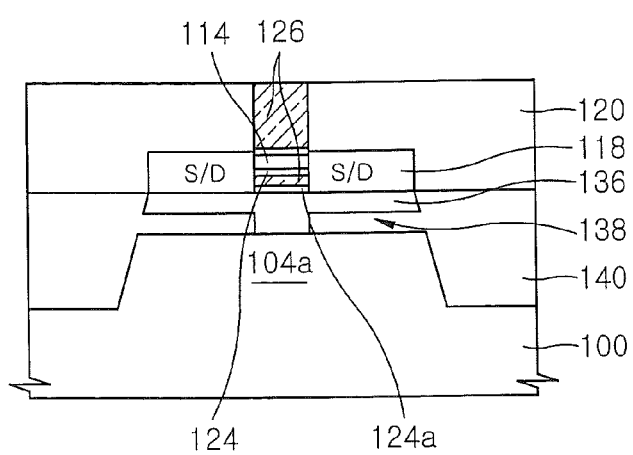

Referring now to FIGS. 17A and 17B, a gate electrode 126 surrounding the first Si layer 114 with the gate insulating layer 124 interposed therebetween may be formed on the resultant substrate of FIGS. 16A and 16B using, for example, a process substantially the same as described previously with reference to FIGS. 2A/B through 11A/B. The gate electrode 126 may be a single layer composed of polysilicon, a composite layer including a polysilicon and a conductive material with a sheet resistivity less than that of polysilicon, a single layer composed of a refractory metal and/or a composite layer of refractory metals.

Methods of manufacturing a gate-all-around integrated circuit device according to further embodiments of the present invention will now be described with reference to FIGS. 18A-25A and 18B-25B. FIGS. 18A through 25A are perspective views and FIGS. 18B through 25B are cross-sectional views taken along the line A-A (shown in FIG. 1A) of FIGS. 18A-25A, respectively. These embodiments generally differ from those previously described in that a second device isolating layer 140 including a partial insulating region 138 is formed on lower surfaces of source/drain regions S/D and a channel layer is formed using another method of forming a stacked structure of a first SiGe layer 112 and a first Si layer 114 in a second opening 122. Note that the operations for forming the partial insulating layer 138 may be substantially identical to those described previously with reference to FIGS. 12A through 16B, which common operations will not be further described herein.

Figure 18A:
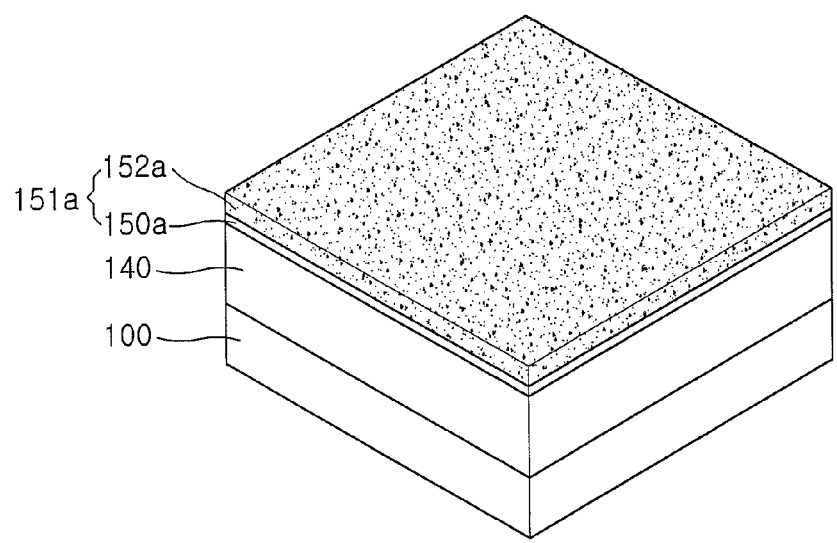
Figure 18B:
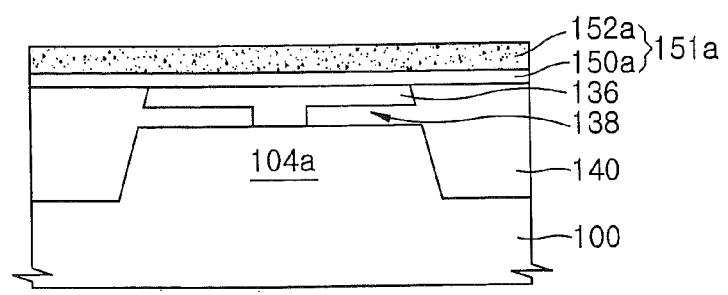

Referring now to FIGS. 18A and 18B, a mask forming material layer 151a is formed on the device isolating layer 140 in a region including the partial insulating region 138. The mask forming material layer 151a may have a stacked structure, including a silicon nitride layer 150a and a silicon oxide layer 152a. The silicon nitride layer 150a may be an etch stop layer that is etch selective to the device isolating layer 140, and may be formed using, for example, CVD, SACVD, LPCVD and/or PECVD.

The silicon oxide layer 152a, which may be used for forming a mask layer (151 of FIG. 19A), may be formed using, for example, CVD, SACVD, LPCVD and/or PECVD. The silicon oxide layer 152a may be deposited to a thickness of 2,000~6,000 Å, and may have a thickness of 3,500~4,500 Å in some embodiments. The selected thickness of the silicon oxide layer 152a may determine a thickness of a subsequently formed gate electrode (126 of FIG. 25B) as will be described further herein.

Figure 19A:
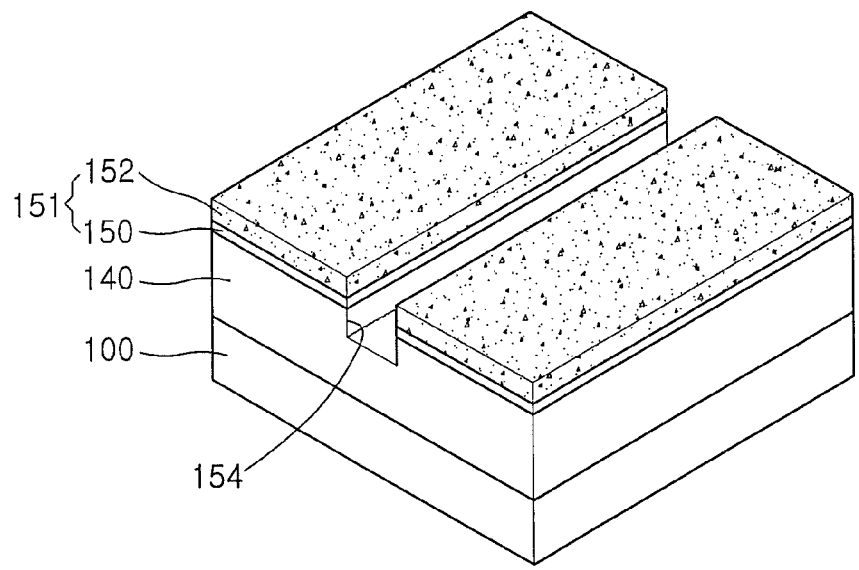
Figure 19B:
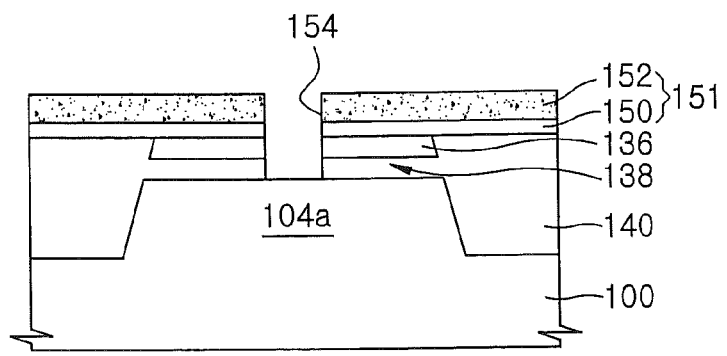

Referring next to FIGS. 19A and 19B, an opening is formed in the mask layer 151 to partially expose a portion of a active region 104a and a portion of the device isolating layer 140, shown as a linearly-shaped opening 154 in the embodiments of FIGS. 19A and 19B, in which a gate electrode may be formed. To form the mask layer 151, a photoresist pattern may be formed to define the mask layer 151 on the mask forming material layer 151a. Thereafter, the mask forming material layer 151a may be partially removed by, for example, anisotropic dry etching, using the photoresist pattern as an etch mask, to form the patterned mask layer 151.

A width of the opening 154 opened by the mask layer 151 may be the same as a width of a subsequently formed gate electrode (126 of FIG. 25B). The mask layer 151 may be formed to extend from one end to the other end of an area where a plurality of the active regions 104a are arranged. For example, an array formed by the plurality of the active regions 104a may extend from one end to the other end of a cell region. The active regions 104a may be arranged, for example, in a linear or zigzag form.

In the embodiments of FIGS. 19A and 19B, the opening 154 extends through a middle portion of the third Si Layer 136, which separates the third Si layer 136 into two regions, where source/drain regions S/D may be formed. The linearly-shaped opening in the mask layer 151 may further increase the processing margin for forming the gate electrode compared to a conventional contact-shaped or bar-shaped mask pattern.

Figure 20A:
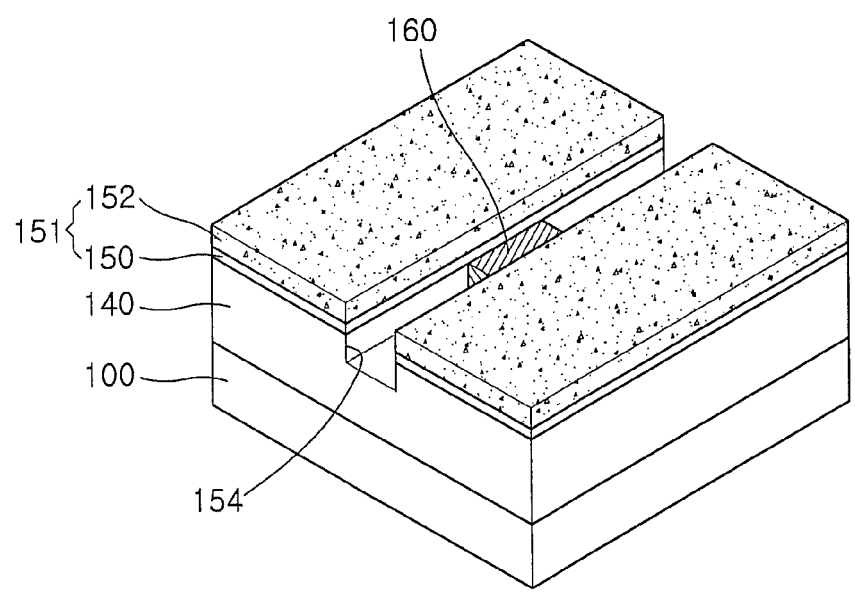
Figure 20B:
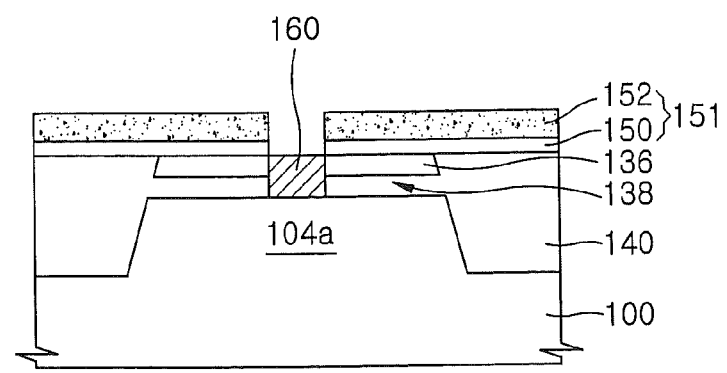

Referring next to FIGS. 20A and 20B, a second SiGe epitaxial layer 160 (which may be referred to herein as a "second SiGe layer") may be formed on the exposed active region 104a. To grow the second SiGe layer 160, $SiH_4$, $SiH_2Cl_2$, $SiCl_4$ and/or $Si_2H_6$ may be used as the Si source gas, and $GeH_4$ gas may be used as the Ge source gas. The second SiGe layer 160 may have 10~30% of Ge density. In some embodiments, the thickness of the second SiGe layer 160 may be may correspond to a bottom surface of the mask layer 151.

Figure 21A:
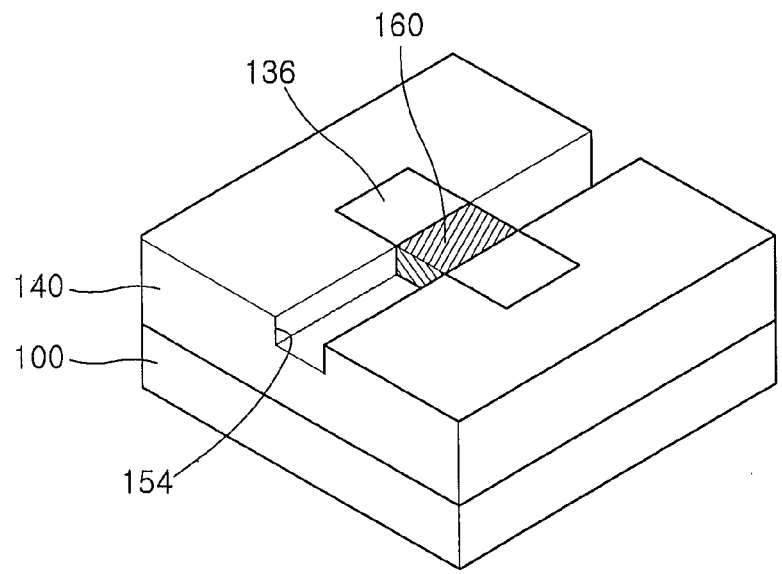
Figure 21B:
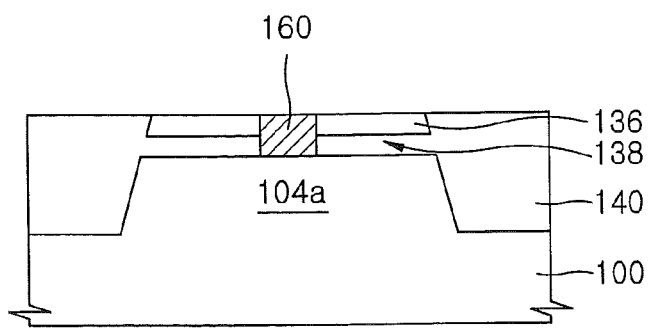

Referring to FIGS. 21A and 21B, the mask layer 151 is shown removed to expose the third Si layer 136. The silicon oxide layer 152 may be removed, for example, using isotropic wet etching, using diluted HF, $NH_4F$ and/or BOE (a mixture of HF and deionized water). The silicon nitride layer 150 may be removed, for example, by anisotropic dry etching.

Figure 22A:
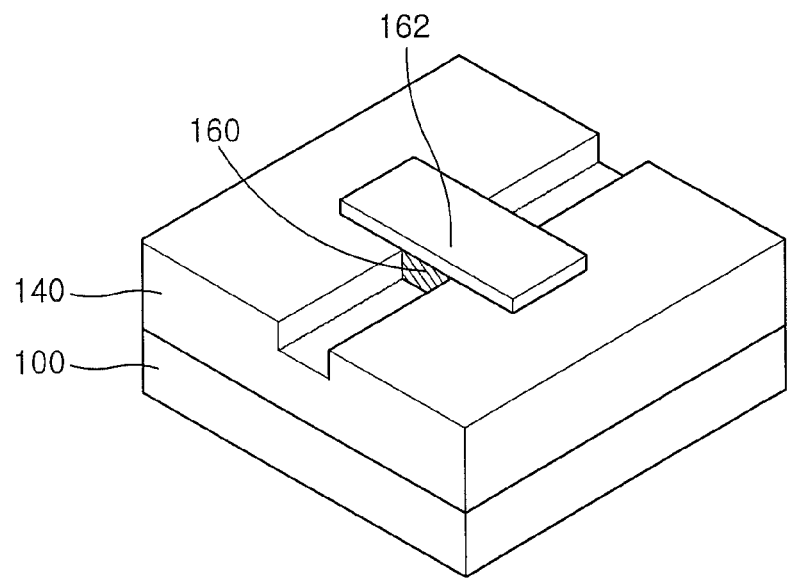
Figure 22B:
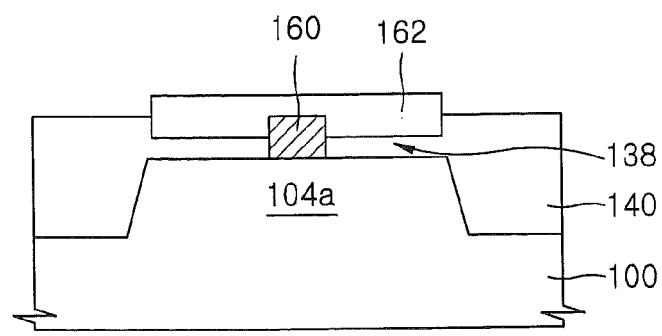

Referring now to FIGS. 22A and 22B, a fourth Si epitaxial layer 162 (which may be referred to herein as a "fourth Si layer") is formed on and includes the third Si layer 136. In other words, the fourth Si epitaxial layer 162 may be formed by further growing the third Si layer 136. The fourth Si epitaxial layer 162 is also shown as formed on the SiGe layer 160 to define a channel region extending between what will be the source/drain regions S/D (see FIG. 25B). The fourth Si layer 162 may be formed, for example, using epitaxy. To form the fourth Si layer 162, $SiH_4$, $SiH_2Cl_2$, $SiCl_4$ and/or $Si_2H_6$ may be used as the Si source gas. As such, the fourth Si layer 162 may be partially buried in the device isolating layer 140, and further project from the device isolating layer 140.

The fourth Si layer 162 in what will be the source/drain regions S/D may be ion implanted with an impurity, such as B and/or $BF_2$, to define a conductivity type of the source/drain regions S/D. As the ion implantation may be confined to the fourth Si layer 162 in what will be the source/drain regions S/D, the efficiency of the ion implantation may be enhanced in some embodiments.

Figure 23A:
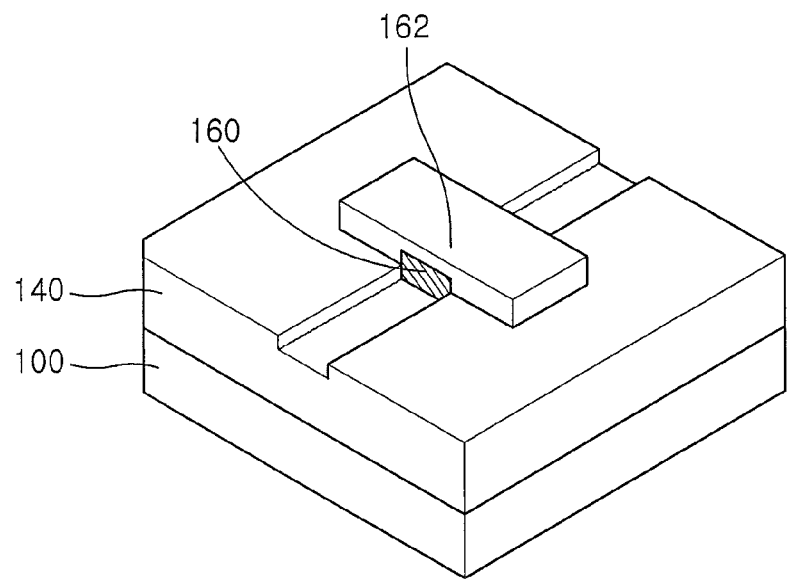
Figure 23B:
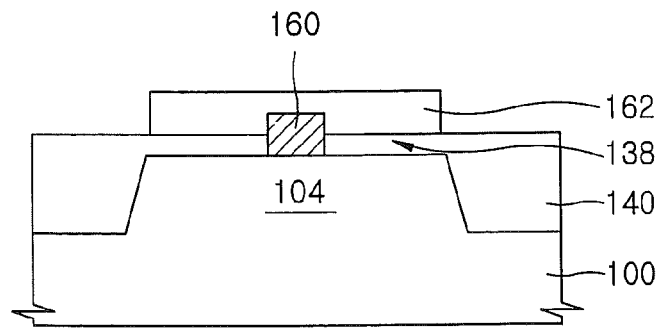

Referring now to FIGS. 23A and 23B, an upper surface of the device isolating layer 140 may be removed by, for example, anisotropic dry etching, to a level substantially even with the upper surface of the partial insulating region 138. As such, an upper and a lower portion of a subsequently formed gate electrode may be insulated by the partial insulating region 138, as contrasted with the structure described with reference to FIGS. 17A and 17B previously. In some embodiments, operation of a bottom transistor formed within the semiconductor substrate 100 may, thereby, be more securely blocked.

Figure 24A:
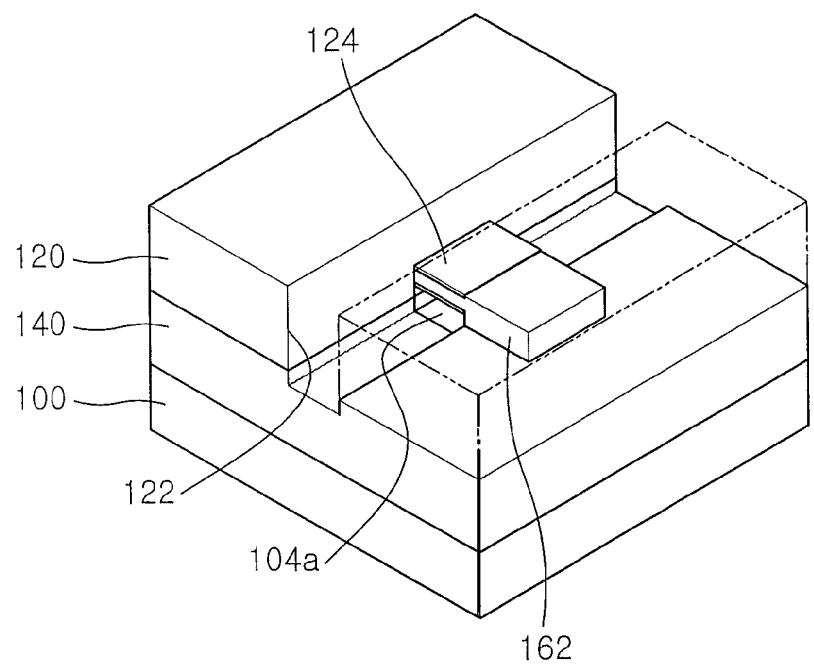
Figure 24B:
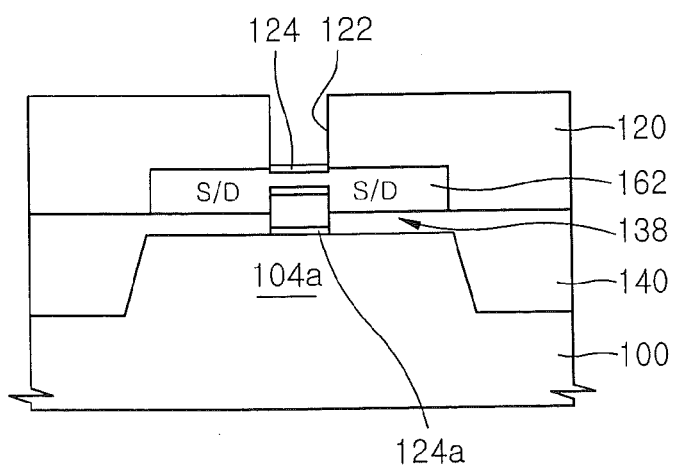

Referring now to FIGS. 24A and 24B, a layer 120 may be formed including a second opening 122, substantially as described previously with reference to the layer 109 and opening 110 of FIGS. 2A and 2B. The second SiGe layer 160, exposed by the second opening 122, may be removed substantially as described with reference to removal of the layer 112 with reference to FIG. 10A to expose the active region 104a. For example, the second SiGe layer 160 may be removed by wet etching and/or chemical dry etching based on an etch selectivity of the semiconductor substrate 100, and the fourth Si layer 162 and the second SiGe layer 160 of at least about 30 in some embodiments. In some embodiments, when the semiconductor substrate 100, the fourth Si layer 162, and the second SiGe layer 162 are composed of Si, epitaxial Si and epitaxial SiGe, respectively, a mixture containing $H_2O_2$, HF and $CH_3COOH$, a mixture containing $NH_4OH$, $H_2O_2$ and $H_2O$, and/or an etchant containing peracetic acid may be used.

The second SiGe layer 160 may be wet etched rather than chemically dry etched in some embodiments. When a wet etchant with an etch rate of several hundreds of Å per minute is used, etching time may be significantly decreased. The etchant with the etch rate of several hundreds of Å per minute may be a mixture including $NH_4OH$, $H_2O_2$ and $H_2O$. For example, standard cleaning solution SC-1 in which a mixing ratio of $NH_4OH$, $H_2O_2$ and $H_2O$ is 1:5:1 may be used, or the proportion of $H_2O$ may be increased, thereby forming a mixing ratio 1:5:20. Such a mixture may be used to remove the SiGe layer 160 when heated to a temperature of 40~75° C. The operations for etching the SiGe layer 160 may be substantially the same as described with reference to embodiments previously described herein.

Annealing may be performed after etching to form a gate insulating layer 124 on the fourth Si layer 162. Annealing may be carried out in an oxygen and/or ozone atmosphere to form the gate insulating layer 124 surrounding the fourth Si layer 162 in the channel region. In addition, a second gate insulating layer 124a may further be formed on the exposed upper surface of the active area 104a as shown in the embodiments of FIG. 24B. The oxidizing of the upper surface of the active area 104a may insulate the subsequently formed gate electrode (126 of FIG. 25B) from the active area 104a. When annealing is performed in an oxygen atmosphere, Si exposed on the surface of the fourth Si layer 162 may be consumed to form a silicon oxide layer on the surface of the fourth Si layer 162. As the result of annealing, a thickness of the fourth Si layer 162 may be decreased as the Si is consumed. As such, the thickness of the fourth Si layer 162 deposited as described with reference to FIG. 22A may be selected to account for the decreased thickness of the fourth Si layer 162 from the later annealing operation.

A temperature and time of annealing may be varied according to the desired thickness of the gate insulating layer 124 to be formed. For example, the annealing may be performed at a temperature for a time selected to form the gate insulating layer 124 to a thickness of about 50~100 Å.

Figure 25A:
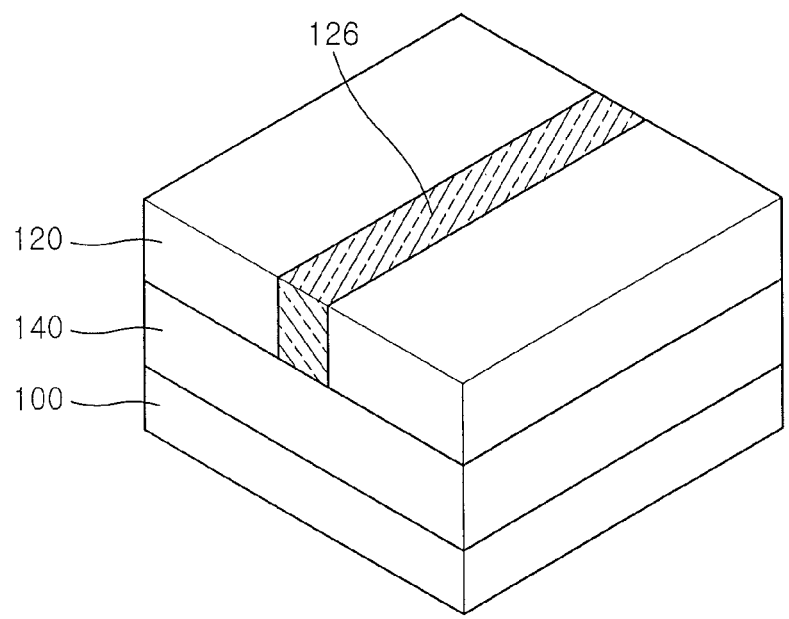
Figure 25B:
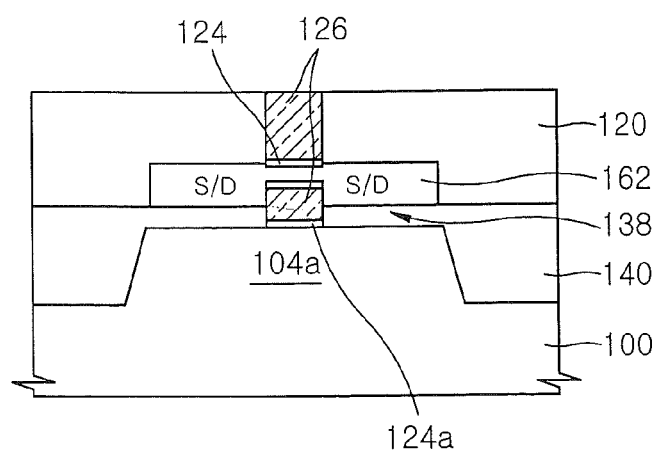

Referring finally to FIGS. 25A and 25B, a gate electrode 126 is shown formed to surround the gate insulating layer 124 disposed on the channel region defined by the fourth Si layer 162 between the source/drain regions S/D. The gate electrode 126 may be a single layer composed of polysilicon, a composite layer composed of polysilicon and a conductive material with a sheet resistivity less than that of polysilicon, a single layer composed of a refractory metal, and/or a composite layer of refractory metals in some embodiments.

The gate electrode 126 may be formed in the mask layer 120 using and opening defined by the linearly shaped mask layer 151 via the damascene method. As a result, as compared with a conventional contact-shaped or bar-shaped mask pattern, the processing margin for forming the gate electrode 126 may be increased.

As described for various embodiments of a gate-all-around semiconductor device in reference to the figures herein, a gate electrode 126 may be formed using the mask layer 120 in a linearly shaped region originally defined using the mask layer 109, 151, where the damascene method may be used in defining the linearly shaped region. By doing so, as compared with a conventional contact-shaped or bar-shaped mask pattern, the processing margin for forming the gate electrode 126 may be increased in some embodiments. The increase of the processing margin may increase the wavelength of the light source used by the exposure facility during fabrication that is required as the integration density is increased, or may allow for using the exposure facility with a conventional light source without increasing the number of apertures. Therefore, the linearly shaped mask layer 109 may be more suitable for the formation of a miniaturizing pattern. Furthermore, the linearly shaped mask layer 107 may limit or even prevent striation produced when forming the gate electrode 126 and thus hard mask may not be required for eliminating the striation.

In addition, source/drain regions S/D may be provided that are partially insulated in some embodiments. In particular, the partial insulating region 138 may limit or even prevent formation of a parasitic transistor within the semiconductor substrate 100. Moreover, the source/drain regions S/D may be formed on the partial insulating region 138 to block operation of the parasitic transistor. The partial insulating region 138 may also limit or even prevent a short channel effect when the channel width is narrow.

In some embodiments, a gate-all-around semiconductor device may be provided that prevents a leakage current flowing between a source/drain region and a semiconductor substrate, while sufficiently securing an overlap margin to form a gate electrode. In some method embodiments, methods of manufacturing a gate-all-around semiconductor device are provided that may prevent a leakage current flowing between a source/drain region and a semiconductor substrate, while sufficiently securing an overlap margin to form a gate electrode.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A gate-all-around integrated circuit device, comprising:
    first and second source/drain regions on an active area of an integrated circuit substrate, wherein the first and second source/drain regions are raised above an upper surface of the integrated circuit substrate;
    a channel region extending between the first and second source/drain regions;
    an insulated gate electrode above the channel region; and
    an insulating region between the first source/drain region and the active area and between the second source/drain region and the active area.

2. The integrated circuit device of claim 1, wherein the insulating region is under the first and second source/drain regions and not overlapped by the insulated gate electrode.

3. The integrated circuit device of claim 1, further comprising a silicon layer between the insulating region and the first and second source/drain regions.

4. The integrated circuit device of claim 3, wherein the insulating region comprises a first portion under the first source/drain region and a second portion under the second source/drain region, and wherein the silicon layer extends under the insulated gate electrode between the first and second portions of the insulating region to the active area.

5. The integrated circuit device of claim 1, wherein the insulating region is a device isolating layer.

6. The integrated circuit device of claim 1, wherein a thickness of the insulating region is about 10 nm to about 40 nm.

7. The integrated circuit device of claim 1, wherein the integrated circuit substrate comprises single-crystalline silicon or Silicon-On-Insulator (SOI).

8. The integrated circuit device of claim 1, wherein the channel region comprises single-crystalline silicon.

9. The integrated circuit device of claim 1, wherein the first and second source/drain regions comprise single-crystalline silicon.

10. The integrated circuit device of claim 1, wherein an upper surface of the channel region is substantially level with an upper surface of the first and second source/drain regions.

11. The integrated circuit device of claim 1, further comprising a thermal silicon oxide gate insulating layer between the gate electrode and the channel region and between the insulated gate electrode and the active area of the integrated circuit substrate.

12. The integrated circuit device of claim 11, wherein a thickness of the gate insulating layer is from about 50 Å to about 100 Å.

13. The integrated circuit device of claim 1, wherein the insulated gate electrode comprises a polysilicon layer, a composite layer including a polysilicon layer and a conductive material layer having a sheet resistivity less than that of the polysilicon layer, a single refractory metal layer and/or a composite layer of refractory metals.

14. The integrated circuit device of claim 1, wherein the insulated gate electrode comprises impurity-doped polysilicon, metal silicide and/or a composite layer including impurity-doped polysilicon.

* * * * *